(12) United States Patent
Sakalkar et al.

(10) Patent No.: US 10,306,797 B2
(45) Date of Patent: May 28, 2019

(54) POWERING ELECTRONIC DEVICES IN A DATA CENTER

(71) Applicant: Google LLC, Mountain View, CA (US)

(72) Inventors: Varun Sakalkar, San Carlos, CA (US);
Jyoti Sastry, Santa Clara, CA (US);
James Kennedy, San Jose, CA (US);
Eduardo Lao, Fremont, CA (US);
Christopher Gregory Malone, Mountain View, CA (US); Pascal Kam, Union City, CA (US)

(73) Assignee: Google LLC, Mountain View, CA (US)

( * ) Notice: Subject to any disclaimer, the term of this patent is extended or adjusted under 35 U.S.C. 154(b) by 1 day.

(21) Appl. No.: 15/395,756

(22) Filed: Dec. 30, 2016

(65) Prior Publication Data

US 2018/0192539 A1 Jul. 5, 2018

(51) Int. Cl.
*H02J 1/10* (2006.01)
*H02J 3/38* (2006.01)
(Continued)

(52) U.S. Cl.
CPC .............. *H05K 7/1492* (2013.01); *G06F 1/26* (2013.01); *H05K 7/1498* (2013.01); *H05K 7/20745* (2013.01)

(58) Field of Classification Search
CPC .... H05K 7/1492; H05K 7/20736; H02B 1/04; H02B 1/20; G06F 1/26
See application file for complete search history.

(56) References Cited

U.S. PATENT DOCUMENTS

| 2,997,627 A | 8/1961 | Ellegood |
|---|---|---|
| 7,570,696 B2 | 8/2009 | Maltsev |

(Continued)

FOREIGN PATENT DOCUMENTS

| EP | 2360848 | 8/2011 |
|---|---|---|
| WO | WO 2009088755 | 7/2009 |
| WO | WO 2014204441 | 12/2014 |

OTHER PUBLICATIONS

Invitation to Pay Additional Fees, and, Where Applicable, Protest Fee, issued in International Application No. PCT/US2017/069106, dated May 2, 2018, 15 pages.

(Continued)

*Primary Examiner* — Jared Fureman
*Assistant Examiner* — Esayas G Yeshaw
(74) *Attorney, Agent, or Firm* — Fish & Richardson P.C.

(57) ABSTRACT

A data center power system includes an enclosure that defines an inner volume; a first direct current (DC) power bus mounted in the inner volume and extending externally to electrically couple to a source of main power; a second DC power bus mounted in the inner volume and extending externally to electrically couple to the source of main power; a plurality of transfer switches mounted in the inner volume, each transfer switch electrically coupled to one of the first DC power bus or the second DC power bus; and a plurality of DC power conductors that are electrically coupled to a pair of transfer switches that includes one transfer switch electrically coupled to the first DC power bus and one transfer switch electrically coupled to the second DC power bus; each DC power conductor configured to electrically couple to a data center rack that supports a plurality of electronic devices.

19 Claims, 11 Drawing Sheets

(51) Int. Cl.
   *H02J 7/34* (2006.01)
   *H05K 7/14* (2006.01)
   *G06F 1/26* (2006.01)
   *H05K 7/20* (2006.01)

(56) References Cited

U.S. PATENT DOCUMENTS

| | | | |
|---|---|---|---|
| 8,686,594 | B2 | 4/2014 | Morales et al. |
| 8,750,393 | B1 | 6/2014 | Alshinnawi |
| 8,907,520 | B2 | 12/2014 | Chapel et al. |
| 9,190,870 | B2 | 11/2015 | Morales et al. |
| 9,287,710 | B2 | 3/2016 | Talkin et al. |
| 9,489,399 | B1 | 11/2016 | Laporte |
| 9,559,607 | B1 * | 1/2017 | Wang .................. G06F 1/3287 |
| 9,923,595 | B2 | 3/2018 | Molina |
| 9,973,006 | B1 * | 5/2018 | Nguyen ................. G06F 1/28 |
| 10,001,825 | B2 * | 6/2018 | Morales ................. G06F 1/30 |
| 2004/0040707 | A1 | 3/2004 | Dusterhoft |
| 2008/0048607 | A1 | 2/2008 | Kono |
| 2009/0287949 | A1 | 11/2009 | Bradicich et al. |
| 2012/0242151 | A1 | 9/2012 | Seaton et al. |
| 2013/0027126 | A1 * | 1/2013 | Jayaraman ............ H02M 3/158 327/547 |
| 2013/0120929 | A1 | 5/2013 | Bianculli et al. |
| 2013/0286575 | A1 | 10/2013 | Chen |
| 2013/0305957 | A1 | 11/2013 | Yang |
| 2013/0320779 | A1 | 12/2013 | Yang |
| 2013/0326242 | A1 | 12/2013 | Yang |
| 2014/0101462 | A1 * | 4/2014 | Rose .................. G06F 1/263 713/300 |
| 2014/0302706 | A1 | 10/2014 | YuQiang |
| 2015/0105930 | A1 * | 4/2015 | Sparrowhawk ........ G01R 11/04 700/297 |
| 2015/0109132 | A1 * | 4/2015 | Wu ..................... H05K 7/1492 340/657 |
| 2015/0109735 | A1 | 4/2015 | Campbell |
| 2015/0130613 | A1 | 5/2015 | Fullam |
| 2015/0200509 | A1 | 7/2015 | Chapel et al. |
| 2015/0207427 | A1 | 7/2015 | Nishikawa |
| 2015/0355630 | A1 | 12/2015 | Cader |
| 2016/0055354 | A1 | 2/2016 | Jinaraj |
| 2016/0259384 | A1 * | 9/2016 | Yu .............................. G06F 1/26 |
| 2016/0308577 | A1 | 10/2016 | Molina |
| 2017/0005510 | A1 * | 1/2017 | Rohr ...................... H02J 9/061 |
| 2017/0005627 | A1 | 1/2017 | Zhao |
| 2017/0049010 | A1 * | 2/2017 | Campbell .......... H05K 7/20836 |
| 2017/0086327 | A1 | 3/2017 | Matsumura |
| 2017/0264493 | A1 * | 9/2017 | Cencini ................ H04L 41/044 |
| 2017/0327006 | A1 | 11/2017 | Lane |

OTHER PUBLICATIONS

Kachris et al., "A Survey on Optical Interconnects for Data Centers," IEEE Communications Surveys & Tutorials, vol. 14, No. 4, Fourth Quarter 2012, 16 pages.

Wang et al., "A survey on the communication architectures in smart grid," Computer Networks 55, 2011, 27 pages.

Javanshir, M.. (2007). DC distribution system for data center. (Thesis). University of Hong Kong, Pokfulam, Hong Kong SAR. Retrieved from http://dx.doi.org/10.5353/th_b3934495, 79 pages.

Gungor et al., "Smart Grid Technologies: Communication Technologies and Standards," IEEE Transactions on Industrial Informatics, vol. 7, Issue 4, Nov. 2011, 10 pages.

PCT International Preliminary Report on Patentability issued in International Application No. PCT/US2017/069106, dated Nov. 14, 2018, 15 pages.

PCT International Search Report and Written Opinion issued in International Application No. PCT/US2017/069106, dated Aug. 23, 2018, 24 pages.

* cited by examiner

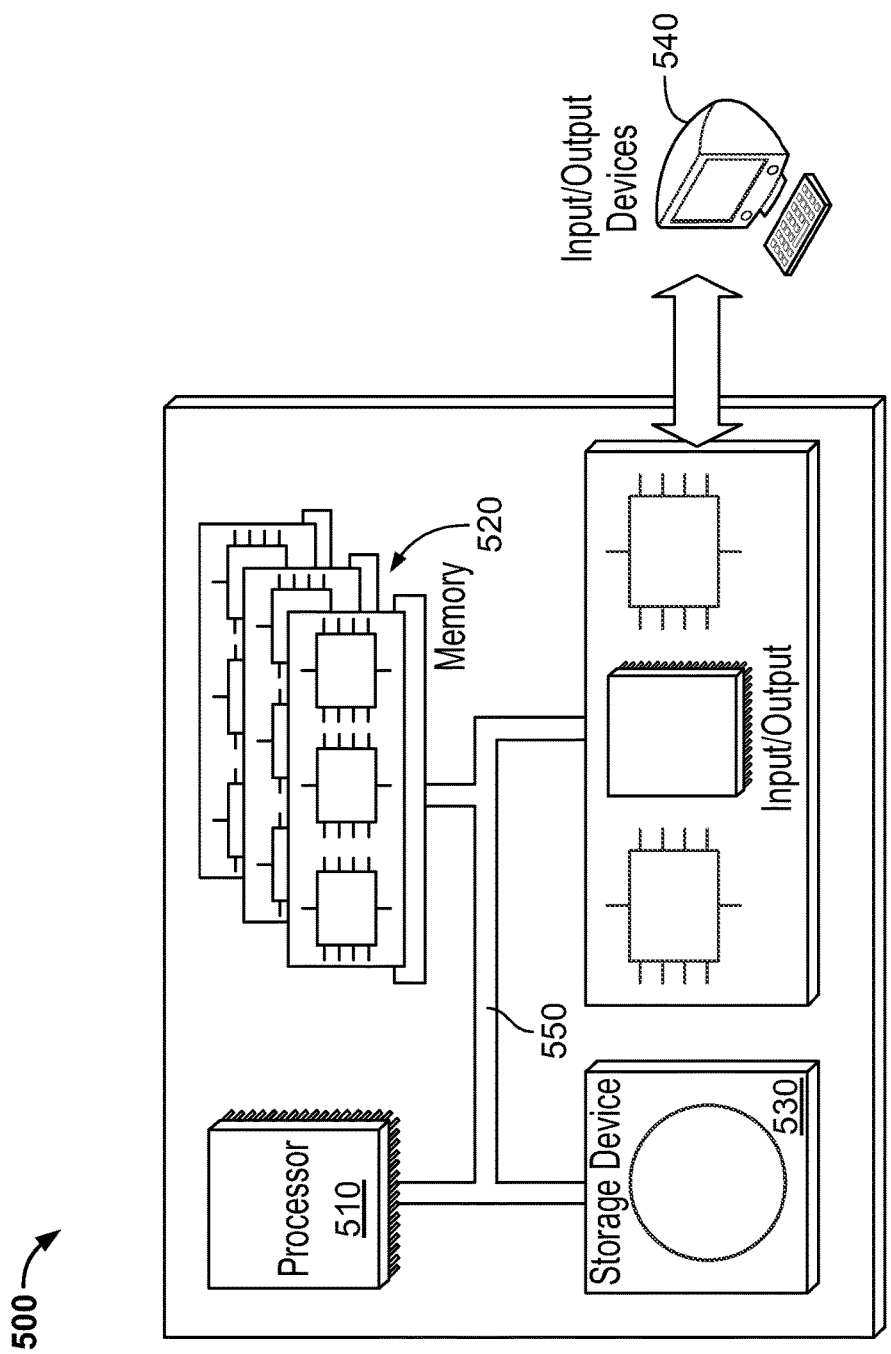

POWERING ELECTRONIC DEVICES IN A DATA CENTER

TECHNICAL FIELD

The present disclosure relates to systems and methods for powering electronic devices, such as servers, network devices, and other electronic devices, in a data center.

BACKGROUND

Data center planning, construction, and deployment to operation typically includes a lengthy time to market factor. Shortening the time to market for a commercial data center can be a large business driver for financial success. One of the drivers of the lengthy time to market to rack and server deployment in a completed data center building. Conventionally, data center information technology (IT) architecture, racks, and servers are required to be physically installed, cabled, and powered up. Mechanical and human errors could be present during the physical installation and powering of the racks and servers.

SUMMARY

In a general implementation, a data center power system includes an enclosure that defines an inner volume; a first direct current (DC) power bus mounted in the inner volume and extending externally from the enclosure to electrically couple to a source of main power; a second DC power bus mounted in the inner volume and extending externally from the enclosure to electrically couple to the source of main power; a plurality of transfer switches mounted in the inner volume, each transfer switch electrically coupled to one of the first DC power bus or the second DC power bus; and a plurality of DC power conductors, each DC power conductor electrically coupled to a pair of transfer switches that includes one transfer switch electrically coupled to the first DC power bus and one transfer switch electrically coupled to the second DC power bus; each DC power conductor configured to electrically couple to a data center rack that supports a plurality of electronic devices.

In an aspect combinable with the general implementation, at least a portion of the plurality of transfer switches includes an automatic transfer switch.

In a further aspect combinable with any of the previous aspects, at least a portion of the plurality of transfer switches includes a fused contact.

In a further aspect combinable with any of the previous aspects, the source of main power is electrically coupled, through a power converter, to the first and second DC power busses.

In a further aspect combinable with any of the previous aspects, the source of main power includes at least one of a utility grid power source or a backup power source.

In a further aspect combinable with any of the previous aspects, the backup power source includes at least one of a generator power source or a renewable power source.

In a further aspect combinable with any of the previous aspects, the first DC power bus and the second DC power bus are isolated from each other in the enclosure.

In another general implementation, a method of delivering direct current (DC) power to a data center rack includes providing DC power from a source of main power to a first DC power bus mounted in an inner volume of an enclosure; providing DC power from the source of main power to a second DC power bus mounted in the inner volume of the enclosure; feeding the DC power from the first DC power bus to a first plurality of transfer switches mounted in the inner volume; feeding the DC power from the second DC power bus to a second plurality of transfer switches, that are exclusive of the first plurality of transfer switches, mounted in the inner volume; supplying: (i) DC power from one of the first plurality of transfer switches, or (ii) DC power from one of the second plurality of transfer switches, to a DC power conductor that is electrically coupled to a data center rack that supports a plurality of electronic devices; and powering the plurality of electronic devices with the supplied DC power.

In an aspect combinable with the general implementation, each of the plurality of transfer switches includes an automatic transfer switch.

In a further aspect combinable with any of the previous aspects, each of the plurality of transfer switches includes a fused contact.

In a further aspect combinable with any of the previous aspects, the source of main power includes alternating current (AC) power, the method further including inverting the AC power to the DC power prior to providing the DC power to the first DC power bus and the second DC power bus.

In a further aspect combinable with any of the previous aspects, the source of main power includes at least one of a utility grid power source or a backup power source.

A further aspect combinable with any of the previous aspects further includes electrically coupling the first and second DC power busses, through a power converter, to both the utility grid power source and the backup power source.

A further aspect combinable with any of the previous aspects further includes detecting a loss of main power from the utility power grid; and based on the detected loss, switching from providing DC power to the first and second DC power busses from the utility power grid to providing DC power to the first and second DC power busses from the backup power source.

A further aspect combinable with any of the previous aspects further includes electrically decoupling one of the first or second DC power busses from the source of main power; performing maintenance on the one of the first or second DC power busses; and concurrently with performing maintenance, feeding the DC power from the other of the first or second DC power busses to the DC power conductor through the respective first or second plurality of transfer switches.

In another general implementation, a data center power system includes a first direct current (DC) switchboard module that includes an enclosure, a first DC power bus mounted in the enclosure and extending externally from the enclosure to electrically couple to a source of main power, a second DC power bus mounted in the enclosure and extending externally from the enclosure to electrically couple to the source of main power, a plurality of transfer switches mounted in the enclosure, each transfer switch electrically coupled to one of the first DC power bus or the second DC power bus, and a plurality of DC power conductors, each DC power conductor electrically coupled to a pair of transfer switches that includes one transfer switch electrically coupled to the first DC power bus and one transfer switch electrically coupled to the second DC power bus; and a first plurality of racks that include a plurality of electronic devices, each of at least a portion of the first plurality of racks electrically coupled to a particular DC power conductor of the first DC switchboard module.

In an aspect combinable with the general implementation further includes a second DC switchboard module that includes an enclosure, a first DC power bus mounted in the enclosure and extending externally from the enclosure to electrically couple to a source of main power, a second DC power bus mounted in the enclosure and extending externally from the enclosure to electrically couple to the source of main power, a plurality of transfer switches mounted in the enclosure, each transfer switch electrically coupled to one of the first DC power bus or the second DC power bus, and a plurality of DC power conductors, each DC power conductor electrically coupled to a pair of transfer switches that includes one transfer switch electrically coupled to the first DC power bus and one transfer switch electrically coupled to the second DC power bus.

In a further aspect combinable with any of the previous aspects, a second plurality of racks that include a plurality of electronic devices, each of at least a portion of the second plurality of racks electrically coupled to a particular DC power conductor of the second DC switchboard module.

In a further aspect combinable with any of the previous aspects, each of another portion of the second plurality of racks is electrically coupled to a particular DC power conductor of the first DC switchboard module, and each of another portion of the first plurality of racks is electrically coupled to a particular DC power conductor of the second DC switchboard module.

In a further aspect combinable with any of the previous aspects, the portion of the second plurality of racks and the other portion of the second plurality of racks are positioned in separate rows of a plurality of rows of racks in the data center.

In a further aspect combinable with any of the previous aspects, the portions of the first and second pluralities of racks are positioned in one particular row of the plurality of rows of racks.

Implementations according to the present disclosure may include one or more of the following features. For example, implementations according to the present disclosure may significantly make deployment, identification, inventory, and maintenance of electronic devices in a data center more efficient relative to conventional techniques. Further, implementations according to the present disclosure may provide for safer, faster, and more flexible power delivery to electronic devices in a data center. Also, implementations according to the present disclosure may facilitate greater redundancy of power delivery to electronic devices in a data center.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 5 is a schematic illustration of an example controller for a data center cooling system according to the present disclosure

DETAILED DESCRIPTION

Figure 1A:
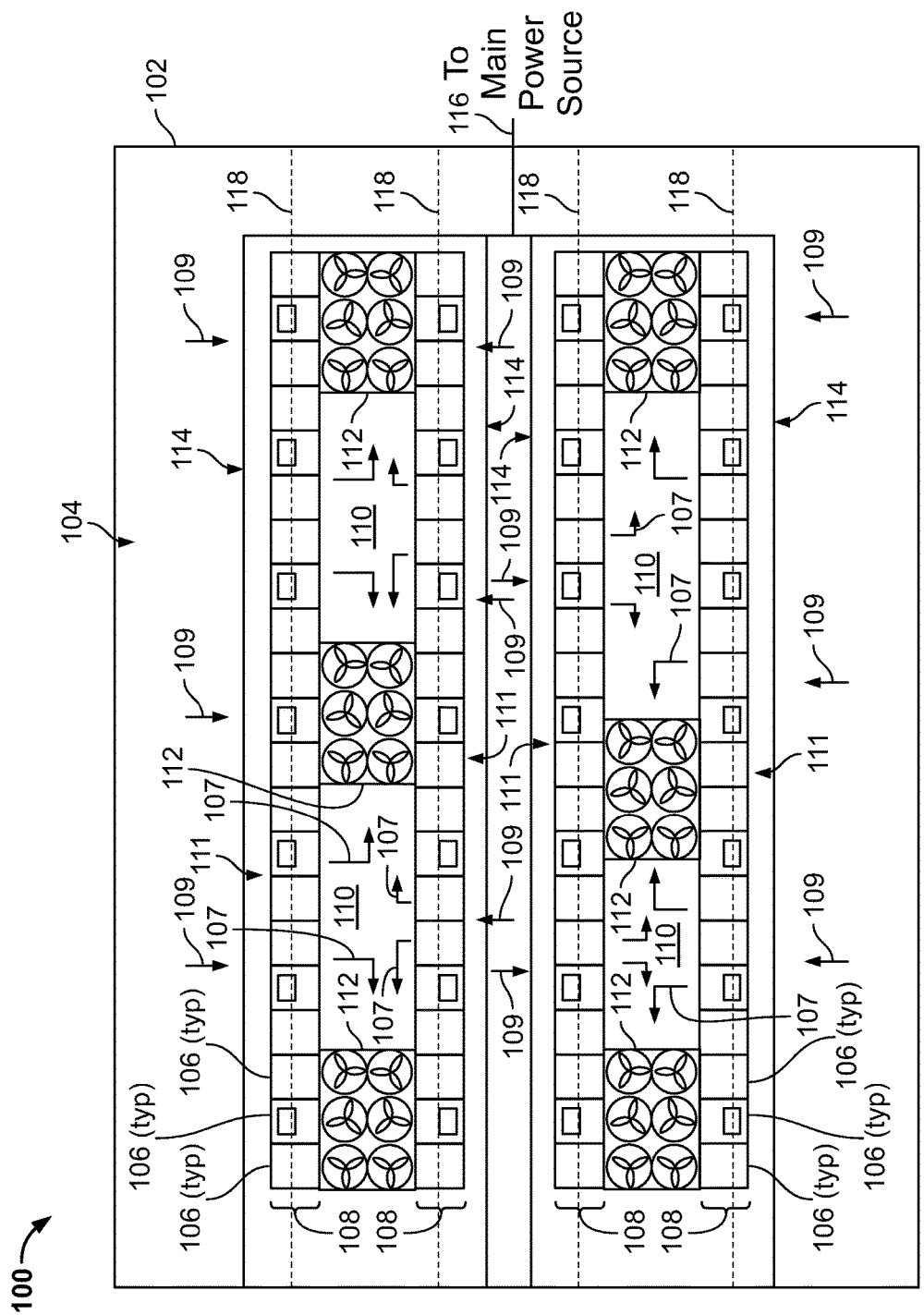
FIG. 1A is a schematic illustration of a top view of an example implementation of a data center power system.

The present disclosure describes implementations, such as systems, apparatus, and methods of data center power systems. In some aspects, the data center power systems include direct current (DC) power delivery systems that supply DC power from one or more main sources of power (e.g., through one or more transformers and/or one or more rectifiers) to server racks to power electronic devices supported in the racks. In some example implementations, a data center power system includes overhead conductors (e.g., lines or bus bars), such as catenary conductors that are installed within a workspace of the data center that encloses the server racks, with a return path (ground) provided on a data center floor or as part of a rack support structure. In some aspects, the server racks may include electrical connectors, such as pantographs that enable the racks to be rolled onto the floor, grounded, and connected to the overhead conductors. Such power systems may allow a server racks to be of variable dimensions (e.g., height, width, or both) and installed at any location on the floor, thereby enabling flexibility of deployment.

In other example implementations, a data center power system includes floor mounted conductors (e.g., rails) laid onto the data center floor adjacent the server racks. The configuration installed on the floor of the data center includes the floor-mounted conductors (e.g., rails) and a ground return path. The server racks include electrical connectors, such as current collectors or conductive shoes that electrically couple the racks to the floor-mounted conductors. The floor-mounted conductors are electrically connected to the main source of data center power to conduct DC electricity to the server racks.

In other example implementations, a data center power system includes a DC power module that contains multiple, concurrently maintainable conductors (e.g., bus bars). Each DC power module electrically connects to a particular server rack and includes a transfer switch directly coupled to the particular server rack to switch (e.g., manually or automatically) from delivering power to the rack through one path to a source of main power to delivering power to the rack through another, separate path to the source of main power. Thus, each rack is dual sourced from the source(s) of main power to enable a loss of a power path to the server rack in a shutdown event, e.g., the path is shutdown for maintenance or due to a malfunction.

In another example implementation, a data center power system includes DC power connectors that electrically couple the server racks to a source of main DC power that deliver power to the server racks and transmit data from (or to) the racks to (or from) a control system. The control system receives the data from the server racks and virtually models the data center based at least in part on the received data. In some aspects, the DC power connectors include an interlocked connector that does not require a human installer to have a specific training/license to electrically couple the server racks to the main power source with the DC power connectors. When electrically coupled to the server racks, the DC power connectors may also facilitate communication between the rack and the connector to enable a power handshake prior to the rack being powered. The DC power connector thereby facilitates a safe power connection to the server rack.

FIG. 1A is a schematic illustration of a top view of an example implementation of a data center power system 100. Generally, the DC power system 100 operates to provide electrical power to electronic devices, such as servers, processors, memory modules, networking devices, and other IT and data processing devices in a data center building 102. In some aspects, the electrical power delivered directly to the electronic devices is direct current (DC) power from a main source of electrical power, such as a utility power grid, on-site power from generators, solar or wind power sources, hydroelectric power sources, nuclear power sources, or other forms of power sources. In some aspects, the main source of power provides alternating current (AC) power that is converted to DC power prior to being delivered to the electronic devices. In some aspects, one or more transformers transform the main source of power from a medium voltage power (e.g., 13.5 kVAC, 4160 VAC) to a low voltage power (e.g., 460 VAC, 230 VAC) and then to a DC power (e.g., 750 VDC, 1500 VDC) prior to being delivered to the electronic devices. The DC power is delivered to the electronic devices by a conductor that is at least partially exposed to a human-occupiable workspace 104 in the data center building 102.

In certain discussions here, distinctions may be made between utility or grid power, and local or on-site power. Unless otherwise stated, utility or grid power is power provided generally to a number of customers by a utility, and its generation and control are handled by the utility. Such utility power may also be generated a long distance from the data center facility. Local or on-site power is used, for the most part, only by facilities at the data center site, and is under control of an operator of the data center site, as opposed to a broader utility company. On-site power may generally include a generator farm at the same property as the data center farm (e.g., a large bank of engine-powered generators, fuel cells, or solar cells) or near the facility, with an essentially dedicated power connection to the facility (e.g., a situation in which a data center contracts to purchase a certain amount of power from a nearby windfarm, and power connections are made directly through the farm and to the data center site without going through the general utility electrical grid).

As shown in FIG. 1A, multiple data center racks 106 are arranged in the human-occupiable workspace 104 of the data center building 102. In some aspects, the racks 106 support the electronic devices, both physically by providing structure for the devices to be placed in and electrically by providing electric power to the devices from the main source of power (e.g., through an rectifier, a transformer, or both). Generally, each illustrated rack 106 (also referred to as a "server rack") may be one of a number of server racks within the data center building 102, which may include a server farm or a co-location facility that contains various rack mounted computer systems. Each server rack 106 may define multiple slots that are arranged in an orderly and repeating fashion within the server rack 106, and each slot is a space in the rack into which a corresponding server rack sub-assembly 134 (shown in FIGS. 1C-1D) can be placed and removed. For example, a server rack sub-assembly can be supported on rails that project from opposite sides of the rack 106, and which can define the position of the slots. Also, although multiple server rack sub-assemblies 134 are illustrated as mounted within the rack 106, there might be only a single server rack sub-assembly.

Figure 1B:
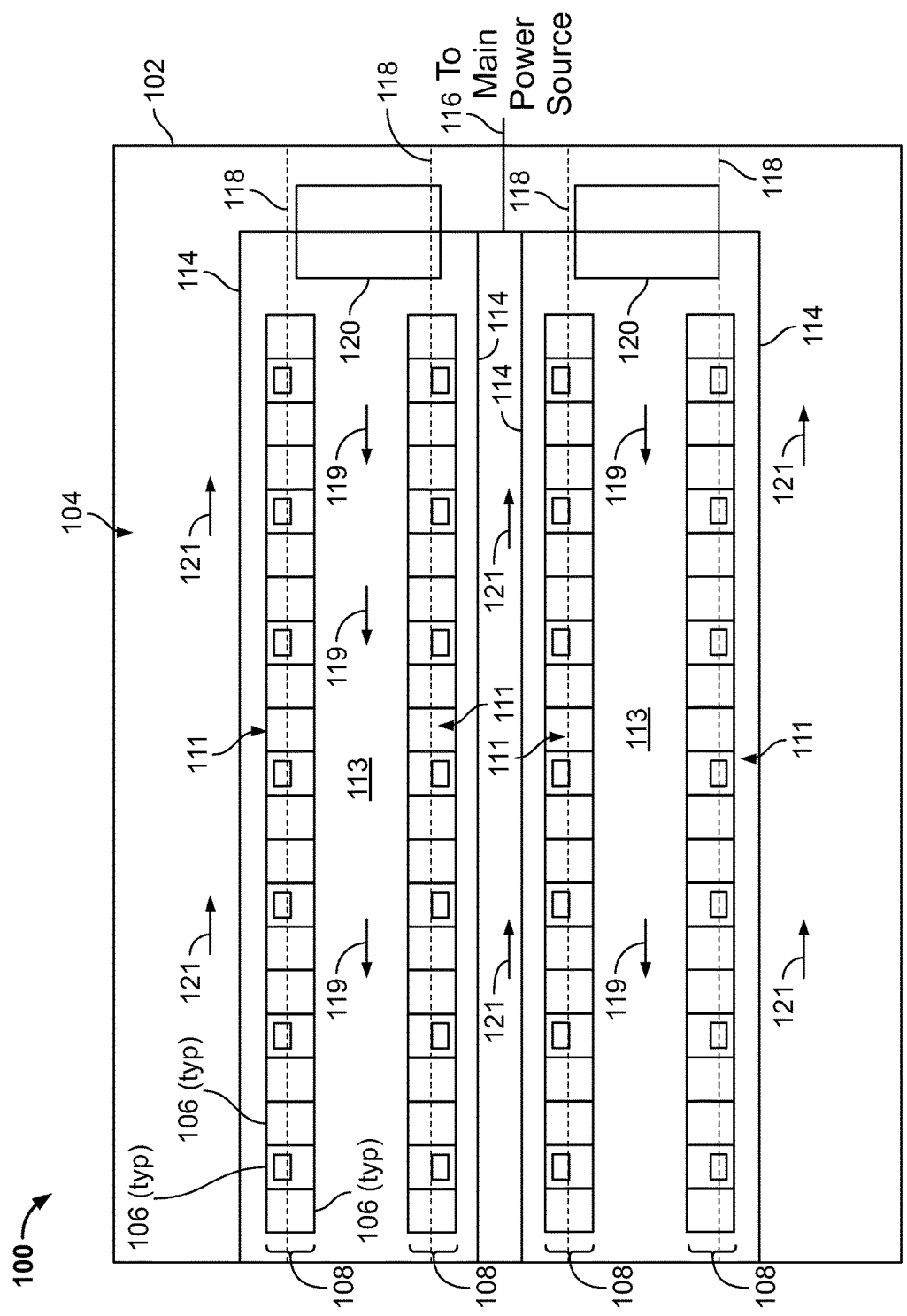
FIG. 1B is a schematic illustration of a top view of another example implementation of a data center power system.
Figure 1C:
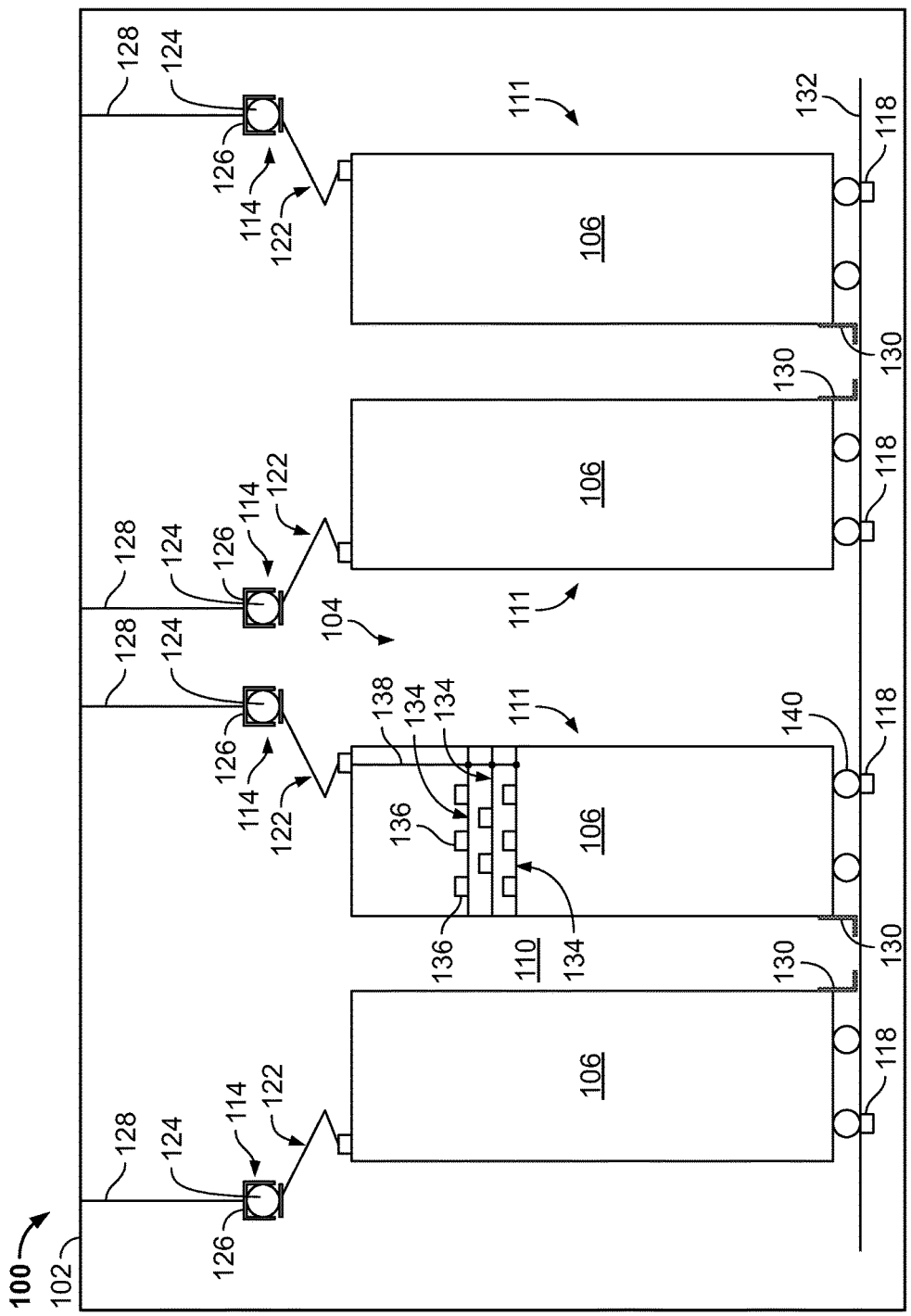
FIG. 1C is a schematic illustration of a side view of an example implementation of a data center power system.
Figure 1D:
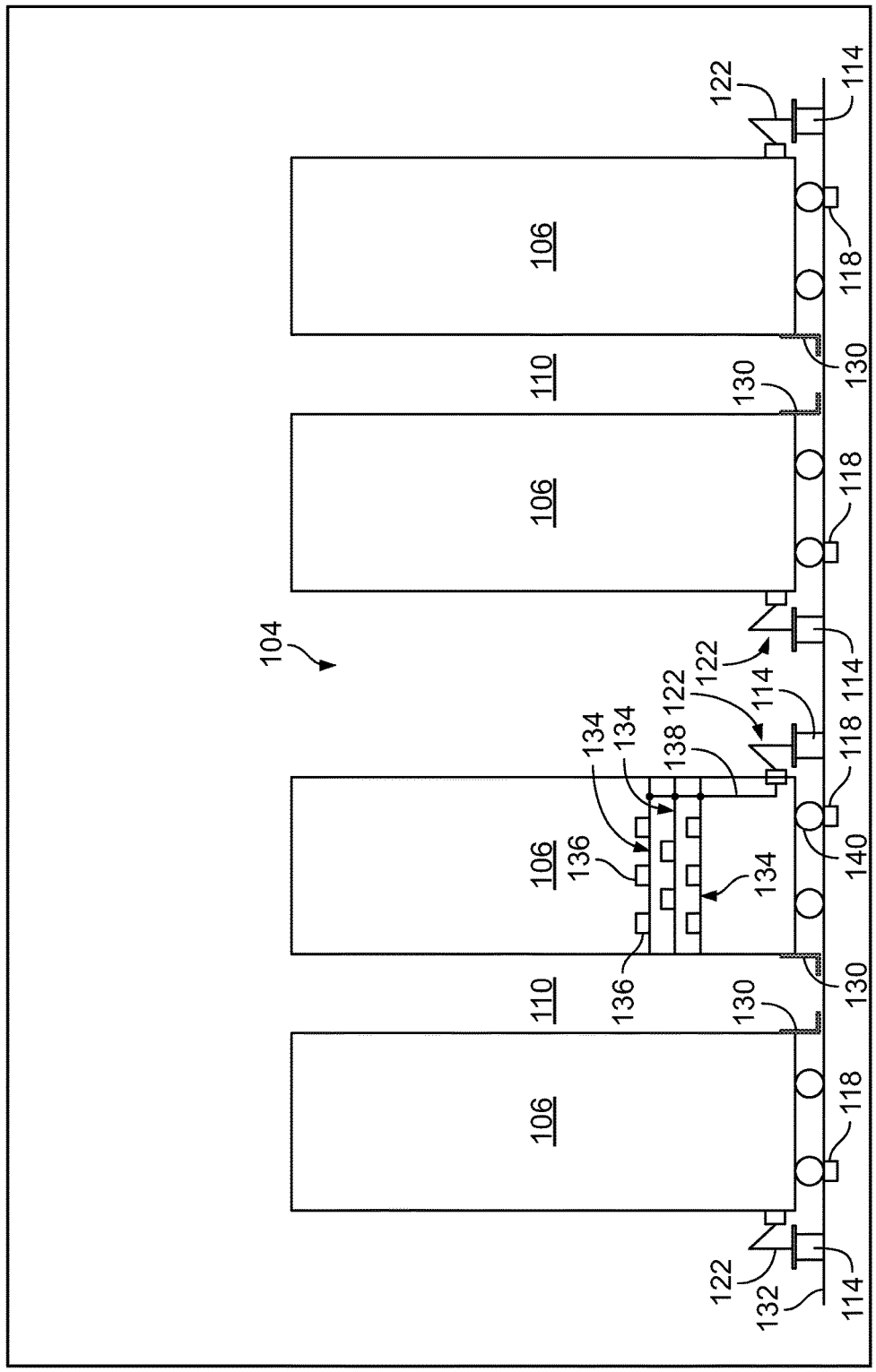
FIG. 1D is a schematic illustration of a side view of another example implementation of a data center power system.

The slots, and the server rack sub-assemblies 134, can be oriented with the illustrated horizontal arrangement (with respect to gravity) as shown in FIGS. 1C-1D. Alternatively, the slots, and the server rack sub-assemblies 134, can be oriented vertically (with respect to gravity). Where the slots are oriented horizontally, they may be stacked vertically in the rack 106, and where the slots are oriented vertically, they may be stacked horizontally in the rack 106.

Server rack 106, as part of a larger data center for instance, may provide data processing and storage capacity. In operation, a data center may be connected to a network, and may receive and respond to various requests from the network to retrieve, process, and/or store data. In operation, for example, the server rack 106 typically facilitates the communication of information over a network with user interfaces generated by web browser applications of users who request services provided by applications running on computers in the datacenter. For example, the server rack 106 may provide or help provide a user who is using a web browser to access web sites on the Internet or the World Wide Web.

The server rack sub-assembly 134 may be one of a variety of structures that can be mounted in a server rack. For example, in some implementations, the server rack sub-assembly 134 may be a "tray" or tray assembly that can be slidably inserted into the server rack 106. The term "tray" is not limited to any particular arrangement, but instead applies to motherboard or other relatively flat structures appurtenant to a motherboard for supporting the motherboard in position in a rack structure. In some implementations, the server rack sub-assembly 134 may be a server chassis, or server container (e.g., server box). In some implementations, the server rack sub-assembly 134 may be a hard drive cage.

Each server rack sub-assembly 134 can include a frame or cage, a printed circuit board, e.g., motherboard, supported on the frame, and one or more electronic devices 136, e.g., a processor or memory, mounted on the printed circuit board. The electronic devices 136 can include, for instance, processors, memories, hard drives, network switches, or other IT components. Other appurtenances, such as cooling devices, fans, uninterruptible power supplies (UPS) (e.g., battery modules) can be mounted to the server rack sub-assembly 134 (or otherwise to a rack 106).

As shown in FIGS. 1A-1B, one or more rows 108 of data center racks 106 are arranged in the data center building 102. Generally, as illustrated in FIGS. 1A-1B, multiple DC conductor assemblies 114 extend through the human-occupiable workspace 104 in parallel (in this example) to the rows 108. In these examples, the DC conductor assemblies 114 extend in parallel to the rows 108 of server racks 106, with each row 108 having a respective DC conductor assembly 114 positioned near or adjacent a front side 111 of the racks 106. Each DC conductor assembly 114 includes at least one live conductor that delivers DC power from a main DC power branch 116 that is electrically coupled to the source of main power (e.g., through one or more transformers and rectifiers).

As further shown in FIGS. 1A-1B, multiple ground conductors 118 also extend through the human-occupiable workspace 104 in parallel (in this example) to the rows 108. In these examples, the ground conductors 118 extend in parallel to the rows 108 of server racks 106, with each row 108 having a respective ground conductor 118 positioned near the racks 106. Each ground conductor 118 provides a low impedance path to "earth" or ground for the DC power delivered by the DC conductor assemblies 114.

With respect specifically to FIG. 1A, a data center cooling system includes cooling units 112 that are positioned in warm air aisles 110 between adjacent rows 108 of server racks 106. Generally, each cooling unit 112 includes one or more cooling coils (e.g., water, liquid, or refrigerant based) and one or more fans shown here as six fans mounted on top ends of the cooling units 112. In this example, the cooling units 112 are positioned between adjacent rows 108 of the server racks 106, i.e., within a warm air aisle 110. In operation, the cooling units 112 circulate a cooling airflow 109 through the front sides 111 of the racks 106 (e.g., that are open to the human-occupiable workspace 104. The cooling airflow 109 receives heat from electronic devices 136 in the racks 106 and warms the airflow 109 to a heated airflow 107 that enters the warm air aisle 110. The heated airflow 107 is drawn into the cooling units 112 (e.g., by the fans) and cooled through the one or more cooling coils (e.g., by a flow of the chilled liquid, condenser water, refrigerant, or an electrically-powered cooler such as a Peltier cooler). The cooled airflow is circulated (e.g., by the fans) back into the human-occupiable workspace 104 adjacent the front sides 111 of the racks 106.

In some aspects, the cooling units 112 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 112 may be stand-alone refrigerant-based (DX) cooling units fluidly coupled to one or more condensing units located external to the data center building 102 (e.g., conventionally known as "CRAC" units).

Although FIG. 1A shows the cooling units 112 as floor-mounted (e.g., supported on a data center floor 132 shown in FIGS. 1C-1D), the cooling units 112 may be ceiling mounted or otherwise suspended above a finished floor (e.g., slab, raised floor, or otherwise). As shown in FIG. 1A, a particular cooling unit 112 may be positioned to cool a particular number of racks 106 within one or more rows 108. In some aspects, the cooling units 112 may be designed or positioned between the rows 108 for redundant operation, e.g., so that cooling units 112 adjacent to a particular unit 112 may have sufficient cooling capacity (e.g., airflow, coil size) if the particular unit 112 fails.

With respect specifically to FIG. 1B, an alternative data center cooling system includes cooling units 120 that are positioned at ends of cool aisles 113 and between rows 108 of the racks 106. Generally, each cooling unit 120 includes one or more cooling coils (e.g., water, liquid, or refrigerant based) and one or more fans (e.g., mounted to circulate a cooling airflow 119 lengthwise down the cool aisles 113). In this example, the cooling units 120 are positioned between adjacent rows 108 of the server racks 106 so that the cooling airflow 11 travels down the aisles 113 and through the open, front sides 111 of the racks 106. The cooling airflow 119 receives heat from electronic devices 136 in the racks 106 and warms the airflow 119 to a heated airflow 121 that circulates back to a return airflow entry of the units 120. The heated airflow 121 is drawn into the cooling units 120 (e.g., by the fans) and cooled through the one or more cooling coils (e.g., by a flow of the chilled liquid, condenser water, refrigerant, or an electrically-powered cooler such as a Peltier cooler). The cooled airflow is circulated (e.g., by the fans) back into the human-occupiable workspace 104 adjacent the front sides 111 of the racks 106 in the aisles 113.

In some aspects, the cooling units 120 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 120 may be stand-alone refrigerant-based (DX) cooling units fluidly coupled to one or more condensing units located external to the data center building 102 (e.g., conventionally known as "CRAC" units).

Although FIG. 1B shows the cooling units 120 as floor-mounted (e.g., supported on a data center floor 132 shown in FIGS. 1C-1D), the cooling units 120 may be ceiling mounted or otherwise suspended above a finished floor (e.g., slab, raised floor, or otherwise). As shown in FIG. 1B, a particular cooling unit 120 may be positioned to cool a particular number of racks 106 within adjacent rows 108. In some aspects, although not shown, there may be additional cooling units 120 positioned on opposite ends of the aisles 113 as those shown in FIG. 1B, e.g., for redundancy or additional cooling capacity. For example, in the case of cooling units 120 mounted at each end of each aisle 113, each particular cooling unit 120 may be responsible for cooling about half of the racks 106 within two adjacent rows (i.e., the halves closest to that particular unit 120). But if a cooling unit 120 at one end fails, the cooling unit 120 at the other end of the same aisle 113 may have sufficient capacity (e.g., airflow and coil capacity) to cool all of the racks 106 within two adjacent rows 108.

Turning to FIG. 1C, this figures illustrates a side view of the example implementation of the data center power system 100 shown in either FIG. 1A or 1B. In the implementation of the system 100 shown in FIG. 1C, the DC conductor assembly 114 is supported (e.g., by a ceiling or other overhead structure of the data center building 102) so that the DC conductor assembly 114 is suspended above a top of the rows 108 of the racks 106. In this example, the DC conductor assembly 114 may form a catenary power conductor to which the electronic devices 136 in the racks 106 are electrically connected. As a catenary power system, the DC conductor assembly 114 may be a rigid (e.g., bus bar) or semi-rigid (e.g., cable) conductor, shown in FIG. 1C as a conductor surface 124 at least partially covered within the human-occupiable workspace 104 with a shroud 126 (or other non-conductive barrier) and suspended by a hanger 128 (e.g., from a ceiling or other structure above the tops of the racks 106).

In this example, the conductor surface 124 may, when powered by the source of main power (e.g., DC power), be a live conductor that carries electricity (e.g., medium or low voltage) to the racks 106. For example, in some aspects, the conductor surface 124 may carry DC power (e.g., 750 VDC, 1000 VDC). In other aspects, the conductor surface 124 may carry medium voltage DC power (e.g., voltage below 1000 VDC), which may be further transformed at the racks 106 to low-voltage power to serve the electronic devices 136.

As shown in the example of FIG. 1C, each rack 106 (or at least a portion of the racks 106 within a particular row 108) may electrically couple to the conductor surface 124 through an electrical connector 122 that is mounted to the rack(s) 106 and electrically coupled to the electronic devices 136 in the server tray sub-assemblies 134 through a connector 138. For example, the electrical connector 122 may be a pantograph (or current collector) that comprises one or more connected arms that are biased (e.g., spring loaded, hydraulically operated, electrically operated, or otherwise) to urge the connector 122 into electrical contact with the conductor surface 124. In some aspects, the connected arms may be urged by a human operator into electrical contact with the conductor surface 124.

In some aspects, the pantograph may be released or urged into electrical contact with the conductor surface 124 when the rack 106 is moved into an operational position. For example, as the rack 106 is deployed within the human-occupiable workspace 104 and into a particular row 108, the rack 106 may abut against a stop 130 that is attached or coupled to the floor 132. The stop 130 may be positioned as, e.g., a linear member (e.g., angle iron or otherwise) that extends within the human-occupiable workspace 104 to define placements of the rows 108. Thus, deployment of each rack 106 may simply include moving (e.g., rolling) the rack 106 (with the electronic devices 136 already installed and electrically-coupled to the electrical connector 122) against the stop 130, thereby ensuring that the rack 106 is correctly positioned within the row 108, to electrically couple to the DC conductor assembly 114, and to electrically couple to the ground conductor 118.

The ground conductor 118, as shown in this example, comprises a conductor that is embedded within the floor 132 (e.g., slab, raised floor, or other support surface) and has at least a portion of the conductor exposed to the human-occupiable workspace 104. Thus, when moved into position against the stop 130, the rack 106 may electrically couple to the ground conductor 118 through conductive casters 140 (or other conductive member that is electrically connected to the rack 106). In alternative implementations, the ground conductor 118 may be mounted above the floor 132 so that contact between the rack 106 (e.g., a conductive member of the rack 106) is above floor level.

In operation, each rack 106 may be moved into position within a particular row 108. The rack 106 may already include the electronic devices 136 mounted on the server-tray sub-assemblies 134 within the rack 106 and electrically connected to the electrical connector 122. Once the rack 106 is moved (e.g., rolled) into a position of operation, e.g., against the stop 130 and electrically connected to the ground conductor 118, the electrical connector 122 may be urged or otherwise moved into an electrical connection with the conductor surface 124. In some aspects, the electrical connector 122 may only be urged (e.g., automatically without human intervention or by human operator intervention) into the electrical connection once the rack 106 is grounded to the ground conductor 118. Electrical power (e.g., DC power) may then be delivered, through the conductor surface 124, through the electrical connector 122, and to the electronic devices 136 in the rack 106.

In alternative embodiments, the DC conductor assembly 114 may be positioned at a location other than above the rows 108 of racks 106. Although above the racks 106 (and not within walking areas in the human-occupiable workspace 104) may be preferable, in some aspects, for example, the DC conductor assembly 114 may be mounted to extend through the warm air aisles 110 at a height between the floor 132 and a top of the racks 106 (or above the racks 106 within the 110).

Turning to FIG. 1D, this figures illustrates another side view of the example implementation of the data center power system 100 shown in either FIG. 1A or 1B. In the implementation of the system 100 shown in FIG. 1D, the DC conductor assembly 114 is mounted to the floor 132 of the data center building 102 so that the DC conductor assembly 114 is positioned and extends lengthwise through the data center building 102 near a bottom of the rows 108 of the racks 106. In this example, the DC conductor assembly 114 may form a rail power conductor to which the electronic devices 136 in the racks 106 are electrically connected. As a rail power system, the DC conductor assembly 114 may be a rigid structural member as a conductor that is exposed to the human-occupiable workspace 104. Although not shown in FIG. 1D, at least a portion of the rail conductor 114 may be covered or shrouded so that only a top surface of the rail conductor 114 may be exposed to the human-occupiable workspace 104.

In this example, the rail conductor 114 may, when powered by the source of main power (e.g., DC power), be a live conductor that carries electricity (e.g., medium or low voltage) to the racks 106. For example, in some aspects, the rail conductor 114 may carry DC power (e.g., 750 VDC, 1000 VDC). In other aspects, the rail conductor 114 may carry medium voltage DC power (e.g., voltage below 1000 VDC), which may be further transformed at the racks 106 to low-voltage power to serve the electronic devices 136.

As shown in the example of FIG. 1D, each rack 106 (or at least a portion of the racks 106 within a particular row 108) may electrically couple to the rail conductor 114 through the electrical connector 122 that is mounted, in this example, to bottom portions of the rack(s) 106 and electrically coupled to the electronic devices 136 in the server tray sub-assemblies 134 through the connector 138. For example, the electrical connector 122 in this example may be a current collector/conductor shoe that comprises one or more connected arms that are biased (e.g., spring loaded or otherwise) to urge the connector 122 into electrical contact with the rail conductor 114.

In some aspects, the current collector/conductor shoe may be released or urged into electrical contact with the rail conductor 114 when the rack 106 is moved into an operational position (e.g., prior to installation of the rail conductor 114 or between the stop 130 and rail conductor 114). In this example, the rail conductor 114 is shown as extending adjacent the front sides 111 of the racks 106. In alternative implementations, the rail conductor 114 may extend through the human-occupiable workspace 104 adjacent back sides of the racks 106 that are opposite the front sides 111, such as within the warm air aisles 110

For example, as the rack 106 is deployed within the human-occupiable workspace 104 and into a particular row 108, the rack 106 may abut against the stop 130 that is attached or coupled to the floor 132. The stop 130 may be positioned as, e.g., a linear member (e.g., angle iron or otherwise) that extends within the human-occupiable workspace 104 to define placements of the rows 108. Thus, deployment of each rack 106 may simply include moving (e.g., rolling) the rack 106 (with the electronic devices 136 already installed and electrically-coupled to the electrical connector 122) against the stop 130, thereby ensuring that the rack 106 is correctly positioned within the row 108, to electrically couple to the rail conductor 114, and to electrically couple to the ground conductor 118.

The ground conductor 118, as shown in this example, comprises a conductor that is embedded within the floor 132 (e.g., slab, raised floor, or other support surface) and has at least a portion of the conductor exposed to the human-occupiable workspace 104. Thus, when moved into position against the stop 130, the rack 106 may electrically couple to the ground conductor 118 through conductive casters 140 (or other conductive member that is electrically connected to the rack 106).

In operation, each rack 106 may be moved into position within a particular row 108. The rack 106 may already include the electronic devices 136 mounted on the server-tray sub-assemblies 134 within the rack 106 and electrically connected to the electrical connector 122. Once the rack 106 is moved (e.g., rolled) into a position of operation, e.g., against the stop 130 and electrically connected to the ground conductor 118, the electrical connector 122 may be urged or otherwise moved into an electrical connection with the rail conductor 114. In some aspects, the electrical connector 122 may only be urged (e.g., automatically without human intervention or by human operator intervention) into the electrical connection once the rack 106 is grounded to the ground conductor 118. Electrical power (e.g., DC power) may then be delivered, through the rail conductor 114, through the electrical connector 122, and to the electronic devices 136 in the rack 106. Of course, in some aspects, the electrical connector 122 may be urged or otherwise moved into an electrical connection with multiple (e.g., two or more) rail conductors 114 (or conductor surfaces 124) simultaneously or substantially simultaneously (e.g., within seconds or less).

Figure 2A:
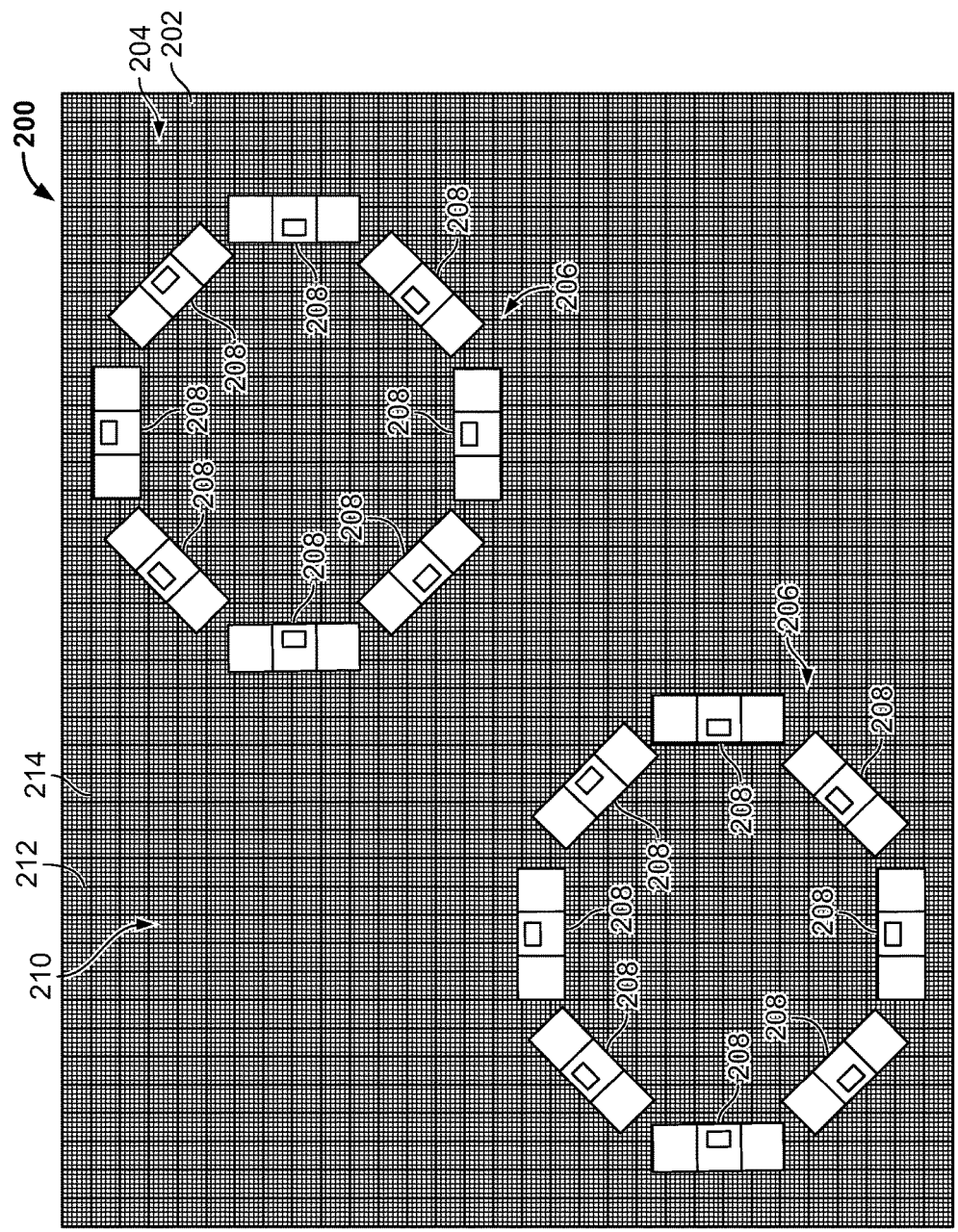
FIGS. 2A and 2B are schematic illustrations of a top view and side view, respectively, of another example implementation of a data center power system.
Figure 2B:
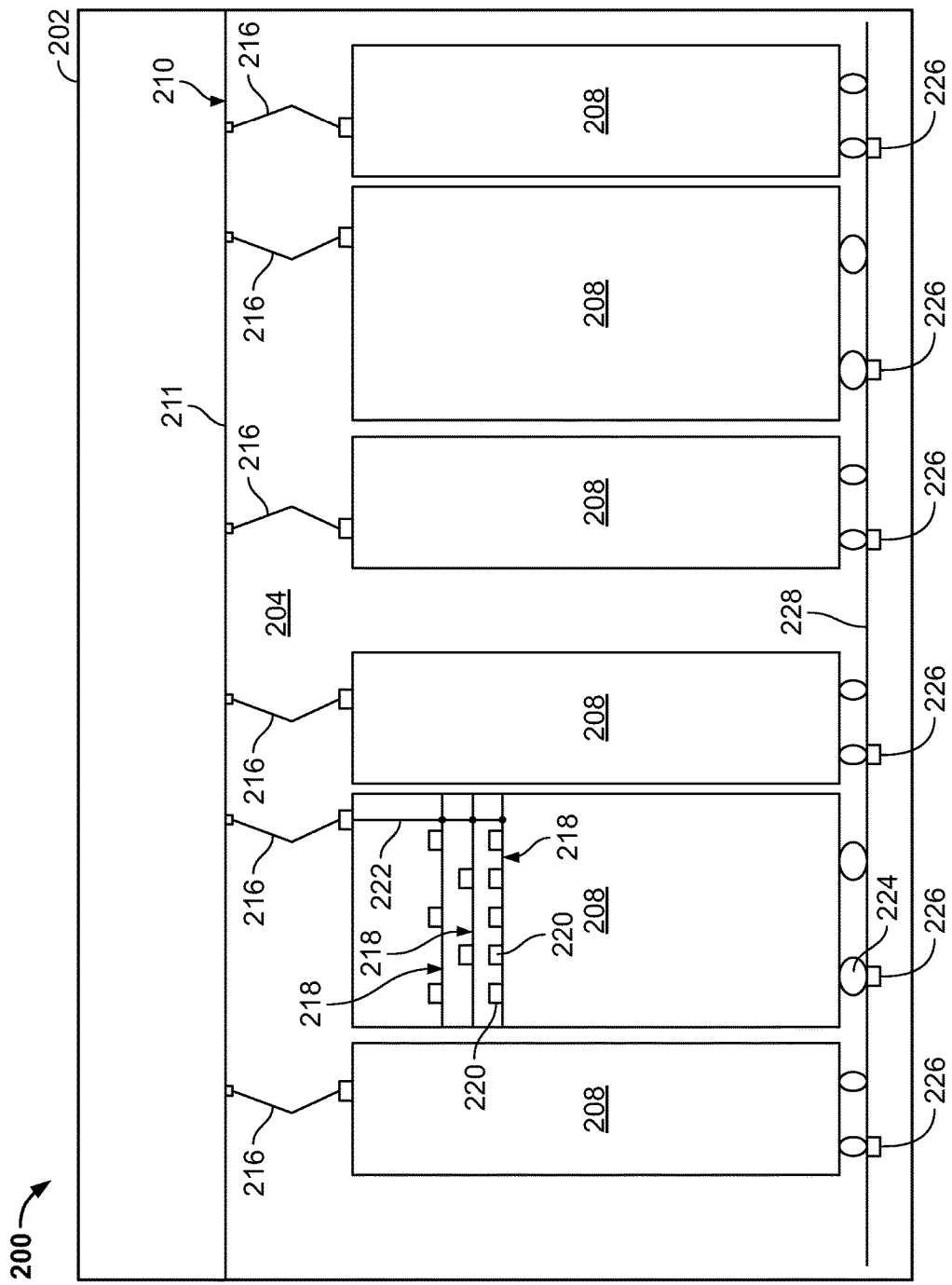

FIGS. 2A and 2B are schematic illustrations of a top view and side view, respectively, of another example implementation of a data center power system 200. Generally, the DC power system 200 operates to provide electrical power to electronic devices, such as servers, processors, memory modules, networking devices, and other IT and data processing devices in a data center building 202. In some aspects, the electrical power delivered directly to the electronic devices is direct current (DC) power from a main source of electrical power, such as a utility power grid, generators, solar or wind power sources, hydroelectric power sources, nuclear power sources, or other forms of power sources. In some aspects, the main source of power provides alternating current (AC) power that is inverted to DC power prior to being delivered to the electronic devices. In some aspects, one or more transformers transform the main source of power from a medium voltage power (e.g., 13.5 kVAC, 4160 VAC) to a low voltage power (e.g., 460 VAC, 230 VAC) and to a DC power (e.g., 750 VDC, 1000 VDC) prior to being delivered to the electronic devices. The DC power is delivered to the electronic devices by a conductor that is at least partially exposed to a human-occupiable workspace 204 in the data center building 202.

As shown in FIG. 2A, multiple data center racks 208 are arranged in the human-occupiable workspace 204 of the data center building 202. In some aspects, the racks 208 support the electronic devices, both physically by providing structure for the devices to be placed in and electrically by providing electric power to the devices from the main source of power (e.g., through a rectifier or power converter, a transformer, or both). Generally, each illustrated rack 208 (also referred to as a "server rack") may be one of a number of server racks within the data center building 202, which may include a server farm or a co-location facility that contains various rack mounted computer systems. Each server rack 208 may define multiple slots that are arranged in an orderly and repeating fashion within the server rack 208, and each slot is a space in the rack into which a corresponding server rack sub-assembly 218 (shown in FIG. 2B) can be placed and removed. For example, a server rack sub-assembly can be supported on rails that project from opposite sides of the rack 208, and which can define the position of the slots. Also, although multiple server rack sub-assemblies 218 are illustrated as mounted within the rack 208, there might be only a single server rack sub-assembly.

The slots, and the server rack sub-assemblies 218, can be oriented with the illustrated horizontal arrangement (with respect to gravity) as shown in FIG. 2B. Alternatively, the slots, and the server rack sub-assemblies 2184, can be oriented vertically (with respect to gravity). Where the slots are oriented horizontally, they may be stacked vertically in the rack 208, and where the slots are oriented vertically, they may be stacked horizontally in the rack 208.

Server rack 208, as part of a larger data center for instance, may provide data processing and storage capacity. In operation, a data center may be connected to a network, and may receive and respond to various requests from the network to retrieve, process, and/or store data. In operation, for example, the server rack 208 typically facilitates the communication of information over a network with user interfaces generated by web browser applications of users who request services provided by applications running on computers in the datacenter. For example, the server rack 208 may provide or help provide a user who is using a web browser to access web sites on the Internet or the World Wide Web.

The server rack sub-assembly 218 may be one of a variety of structures that can be mounted in a server rack. For example, in some implementations, the server rack sub-assembly 218 may be a "tray" or tray assembly that can be slidably inserted into the server rack 208. The term "tray" is not limited to any particular arrangement, but instead applies to motherboard or other relatively flat structures appurtenant to a motherboard for supporting the motherboard in position in a rack structure. In some implementations, the server rack sub-assembly 218 may be a server chassis, or server container (e.g., server box). In some implementations, the server rack sub-assembly 218 may be a hard drive cage.

Each server rack sub-assembly 218 can include a frame or cage, a printed circuit board, e.g., motherboard, supported on the frame, and one or more electronic devices 220, e.g., a processor or memory, mounted on the printed circuit board. The electronic devices 220 can include, for instance, processors, memories, hard drives, network switches, or other IT components. Other appurtenances, such as cooling devices, fans, uninterruptible power supplies (UPS) (e.g., battery modules) can be mounted to the server rack sub-assembly 218 (or otherwise to a rack 208).

As shown in FIGS. 2A-2B, the data center racks 106 are arranged in the data center building 202 in groups 206 of racks 208. Generally, as illustrated in FIGS. 2A-2B, a DC conductor assembly 210 is planarly positioned in the human-occupiable workspace 204 above the groups 206 of racks 208. As shown, each group 206 of racks 208 may be in a circular arrangement. In other aspects, the groups 206 of racks 208 may be in an arrangement that is non-linear (e.g., not in a row), but other than circular.

In this examples, the DC conductor assembly 210 includes a conductor surface 211 that extends in a planar direction through the human-occupiable workspace 204 in above the groups 206 of server racks 208. The DC conductor assembly 210 includes multiple live conductors 212 and 214 that criss-cross the planar assembly 210 that delivers DC power from a main DC power source (e.g., through one or more transformers and rectifiers). For example, as shown in FIG. 2A, the live conductors 212 and 214 extend in respective orthogonal directions across the human-occupiable workspace 204. In some aspects, the live conductors 212 and 214 can deliver power (e.g., DC power) to the planar surface 211 of the assembly 210, thereby electrically energizing the planar surface 211 to become an electrically conductive surface.

As further shown in FIG. 2B, multiple ground conductors 226 also extend through the human-occupiable workspace 204. In this example, the ground conductors 226 extend in parallel placements through a floor 228 of the data center building 202. Each ground conductor 226 provides a low impedance path to "earth" or ground (or alternatively, a high impedance or solidly grounded system) for the DC power delivered by the DC conductor assembly 210.

Although not shown in FIG. 2A, the data center building 202 may also include a data center cooling system. For example, the data center cooling system may be similar or identical to the systems 112 or 120 shown in FIGS. 1A and 1B, respectively. In other aspects, a data center cooling system may include a conventional overhead cooling system or a conventional underfloor cooling system, using chilled liquid, direct expansion refrigerant, evaporative cooling, or otherwise.

Turning to FIG. 2B, this figures illustrates a side view of the example implementation of the data center power system 200 shown in FIG. 2A. In the implementation of the system 200 shown in FIG. 2B, the DC conductor assembly 210 is supported (e.g., by a ceiling or other overhead structure of the data center building 102) so that the DC conductor assembly 210 (and criss-crossing conductors 212 and 214 that electrically power the conductor surface 211) is suspended above a top of the groups 206 of the racks 206.

In this example, the conductor surface 211 may, when powered by the source of main power (e.g., DC power) through the conductors 212 and 214, be a live conductor surface that carries electricity (e.g., medium or low voltage) to the racks 208. For example, in some aspects, the conductor surface 211 may carry DC power (e.g., 750 VDC or other voltage below 1000 VDC). In other aspects, the conductor surface 211 may carry a DC voltage power, which may be further transformed at the racks 208 to another voltage power to serve the electronic devices 218.

As shown in the example of FIG. 2B, each rack 208 (or at least a portion of the racks 208 within a particular group 206) may electrically couple to the conductor surface 211 through an electrical connector 216 that is mounted to the rack(s) 208 and electrically coupled to the electronic devices 220 in the server tray sub-assemblies 218 through a connector 222. For example, the electrical connector 216 may be a pantograph that comprises one or more connected arms that are biased (e.g., spring loaded or otherwise) to urge the connector 216 into electrical contact with the conductor surface 211.

In some aspects, the pantograph may be released or urged into electrical contact with the conductor surface 211 when the rack 208 is moved into an operational position. For example, as the rack 208 is deployed within the human-occupiable workspace 204 and into a particular group 206. Although FIG. 2B does not show a rack step, such as the stop 130 shown in FIGS. 1C-1D, a similar stop or guide device may be used to correctly position the racks 208 in the groups 206. In other aspects, an operator may move a particular rack 208 into a group 206 without a stop or guide. For instance, because the conductor surface 211 may provide the conductive surface 211 over all or most of an area of the human-occupiable workspace 204 above the racks 208, the racks 208 may not require to be placed in specific positions within the human-occupiable workspace 204.

Each ground conductor 226, as shown in this example, comprises a conductor that is embedded within the floor 228 (e.g., slab, raised floor, or other support surface) and has at least a portion of the conductor exposed to the human-occupiable workspace 204. Thus, when moved into position, the rack 208 may electrically couple to the ground conductor 226 through conductive casters 224 (or other conductive member that is electrically connected to the rack 208).

In operation, each rack 208 may be moved into position within a particular group 206 (or, even, at random, non-grouped positions in the human-occupiable workspace 204). The rack 208 may already include the electronic devices 220 mounted on the server-tray sub-assemblies 218 within the rack 208 and electrically connected to the electrical connector 216. Once the rack 208 is moved (e.g., rolled) into a position of operation, e.g., electrically connected to the ground conductor 226, the electrical connector 216 may be urged or otherwise moved into an electrical connection with the conductor surface 211. In some aspects, the electrical connector 216 may only be urged (e.g., automatically without human intervention or by human operator intervention) into the electrical connection once the rack 208 is grounded to the ground conductor 226. Electrical power (e.g., DC power) may then be delivered, through the conductor surface 211, through the electrical connector 216, and to the electronic devices 220 in the rack 208.

Figure 3A:
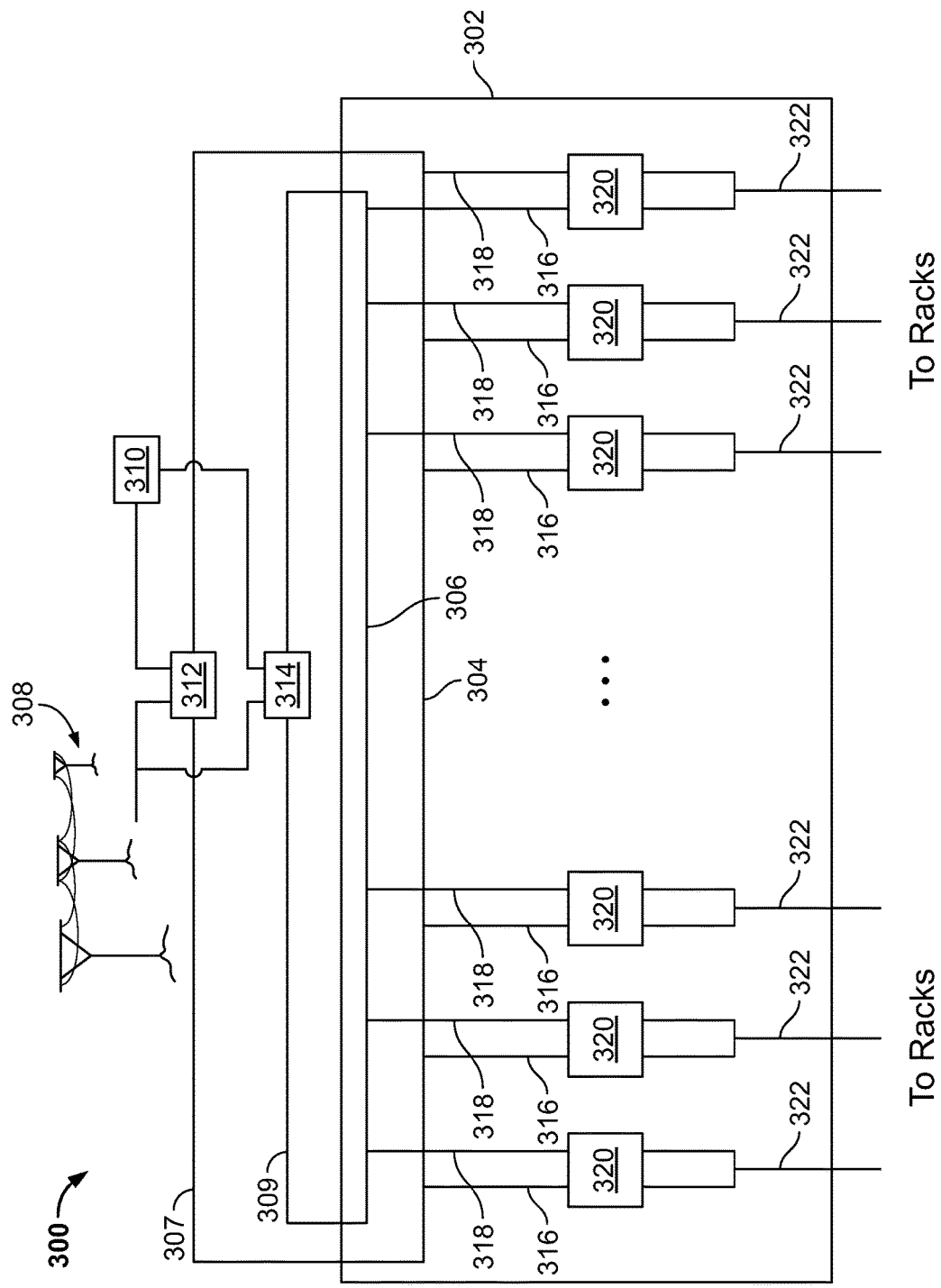
FIG. 3A is a schematic illustration of a direct current (DC) data center power module.

FIG. 3A is a schematic illustration of a direct current (DC) data center power module 300 ("DC power module 300"). Generally, the DC power module 300 electrically couples multiple data center racks, or server racks, to multiple electrical paths to a data center main power source (or sources). Further, the DC power module 300 may provide for switchable (e.g., manually or automatically) power sources for each server rack in a data center, thereby ensuring that any particular rack is connected by multiple power source paths to one or more sources of main power for redundancy. Thus, if a particular path from a main power source becomes electrically decoupled (e.g., through malfunction or otherwise) from the server racks, a redundant path is available for electrical power to be delivered to the server racks.

As shown in FIG. 3A, the DC power module 300 includes a housing 302 (e.g., an enclosure, cabinet, or otherwise) that encloses multiple transfer switches 320. In some aspects, the DC power module 300 may include a number of transfer switches 320 that is more than (e.g., double) to a number of server racks within a particular group of server racks (e.g., a row, a portion of a row, a non-linear group, or otherwise). Each transfer switch 320 may be an automatic transfer switch or manual transfer switch. For instance, each transfer switch 320 may control delivering electrical power (e.g., DC power) to a particular server rack from one power source path.

As shown in FIG. 3A, each transfer switch 320 is either coupled to a main (or first) DC power bus 304 through a main (or first) power connection 316 or coupled to a secondary (or second) DC power bus 306 through a secondary (or second) power connection 318. Generally, the main and secondary power busses 304 and 306 may comprise bus bars (e.g., copper bus bars). The main DC power bus 304 is electrically coupled, external to the housing 302 (and possibly outside of a data center building) to a main converter 314. The secondary DC power bus 306 is electrically coupled, external to the housing 302 (and possibly outside of a data center building) to a secondary converter 312. In some aspects, the main and secondary DC power busses 304 and 306 are isolated (e.g., physically, electrically, or both) within the housing 302.

Each converter 312 and 314, generally, receives electrical power from one or more sources of main power (308 and 310) and delivers adjusted electrical power to the respective DC power busses 304 and 306. For example, in some aspects, the main power sources may be a utility grid power source 308 and a backup generator power source 310. Other sources of main power—independent of the utility grid power source 308 and generator power source 310—may include, for instance, a solar power source, a wind power source, nuclear power source, natural gas or coal power source, or otherwise.

The adjusted electrical power delivered by the converters 312 and 314 may be adjusted from AC power to DC power. For example, the main sources of power 308 and 310 may generate AC power, and the converters 312 and 314 may invert the AC power to DC power to deliver to the DC power module 300. Further, the main sources of power may generate or deliver medium voltage power (e.g., 13.5 kV) to the converters 312 and 314. The converters 312 and 314 (acting also as transformers) may transform the high voltage power to low voltage power (e.g., between 200V and 5000 V) or even a DC power (e.g., less than 1000 VDC). Thus, each of the converter 312 and 314 may represent a power converter (e.g., from AC to DC) or as a power converter and transformer.

As shown in this example, each pair of the transfer switches 320 connect into a single electrical conductor 322 that extends to the exterior of the housing 302 to electrically couple to a particular server rack (among tens, hundreds, or even of thousands of server racks) in the data center. Thus, in this example implementation of the DC power module 300, each server rack is electrically coupled to, and receives power (e.g., DC power) through a particular pair of transfer switches 320.

In some aspects, the DC power busses 304 and 306 provide for separately maintainable bus bars that ensure that DC power is delivered from the DC power module 300 to the server racks even if one of the busses 304 or 306 is non-functional. For example, in some cases, one of the power busses 304 or 306 may be non-functional due to maintenance or repair. In such cases, each of the power busses 304 and 306 may be separately maintainable while the other of the busses 304 or 306 (not being maintained) may deliver DC power to the transfer switches 320.

Figure 3B:
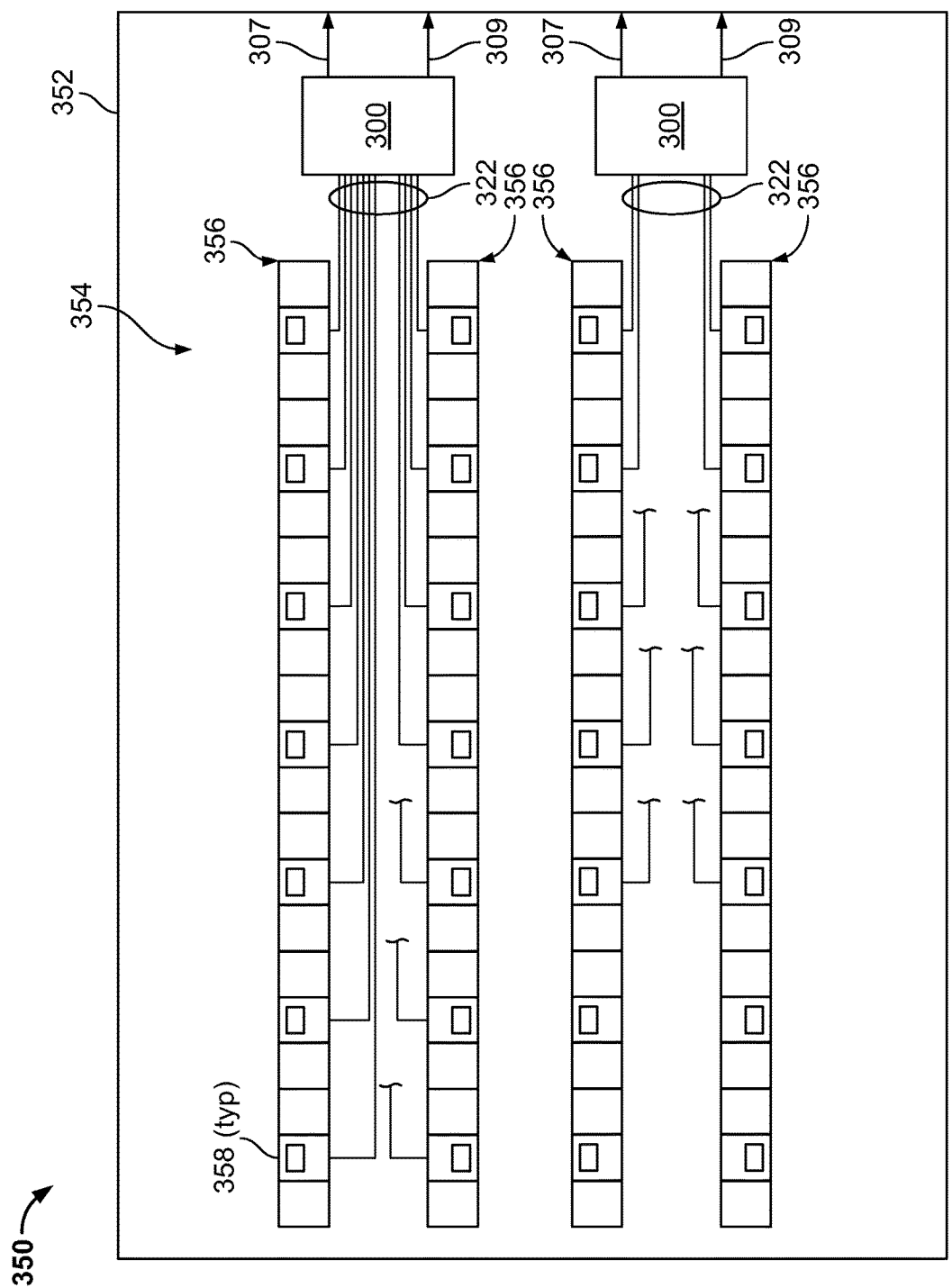
FIGS. 3B-3C are schematic illustrations of example implementations of data centers with racks powered by one or more DC data center power modules of FIG. 3A.
Figure 3C:
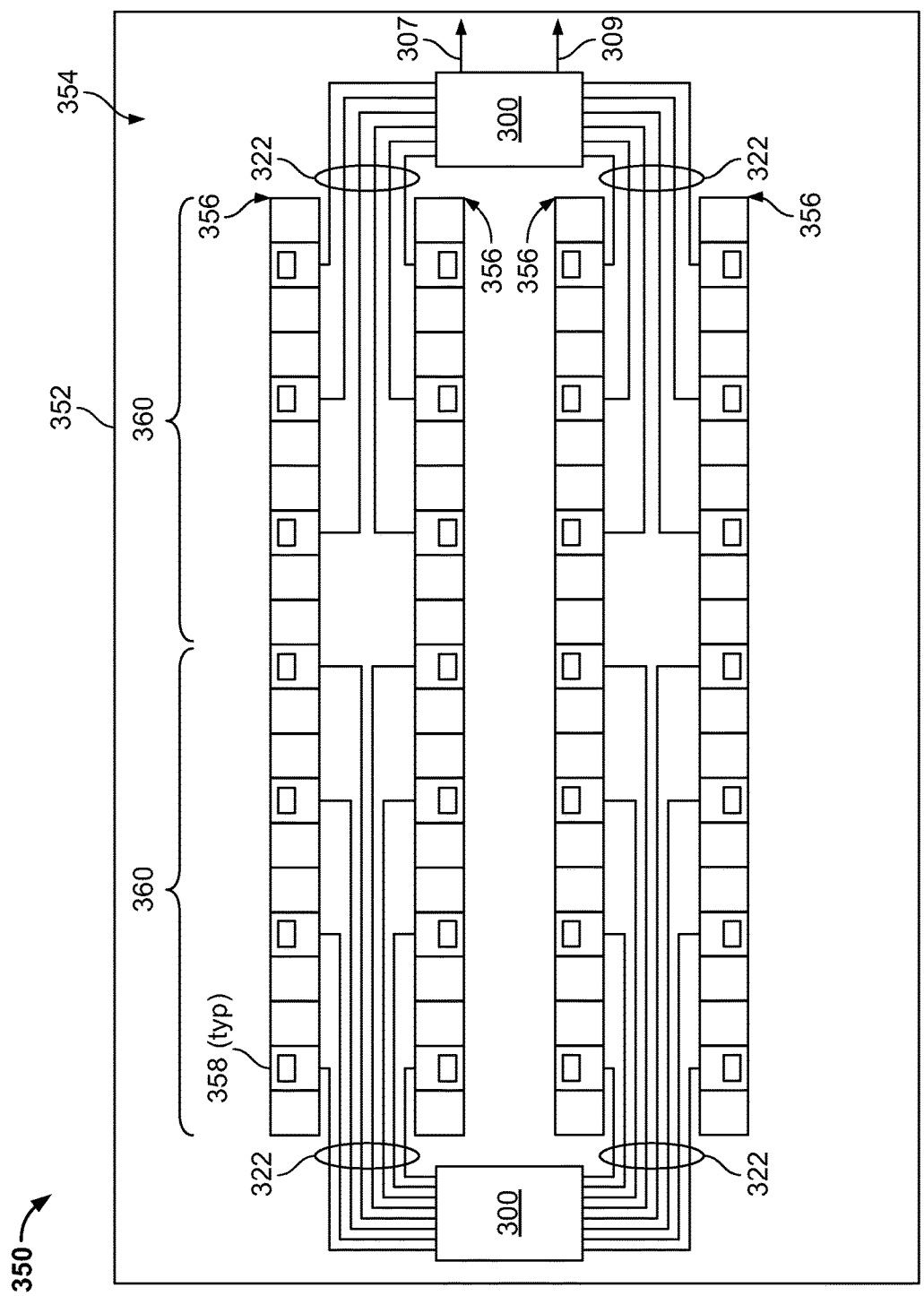

FIGS. 3B-3C are schematic illustrations of example implementations of data centers 350 with racks 358 powered by one or more DC data center power modules 300 of FIG. 3A. For example, in the example data center 350 of FIG. 3A, which includes a data center building 352 that defines a human-occupiable workspace 354, there are two DC power modules 300, with each module 300 serving a particularly defined portion of server racks 358 in the data center 350. In this example, the particular portion includes the racks 358 that are positioned in two, adjacent rows 356. Thus, in this example, there is a unique and independent DC power module 300 through which power (e.g., DC power) is provided to two rows 356 of racks 358.

Alternatively, in some example configurations, a single row 356 of racks 358 may be served (e.g., receive DC power) from a particular DC power module 300 (e.g., a 1 to 1 ratio of rows 358 to DC power modules 300). In some other example, configurations, a single row 356 of racks 358 may be served (e.g., receive DC power) from two or more DC power modules 300 (e.g., a 1 to n ratio of rows 358 to DC power modules 300, with n>1). In some other example, configurations, two or more rows 356 of racks 358 may be served (e.g., receive DC power) from a single DC power module 300 (e.g., an n to 1 ratio of rows 358 to DC power modules 300, with n>1). Of course, in some example implementations, a number of racks 358 may be grouped in non-linear arrangement (e.g., such as a cluster or other arrangement), and one or more DC power modules 300 may server a particular group or groups of racks 358.

Turning to FIG. 3B, in the example data center 350 of this figure, there are two DC power modules 300, with each module 300 serving one or more racks 358 in several rows 356. In this example, one of the DC power modules 300 serves a number of racks 358 in each row 356 shown in this example arrangement. For example, as shown, a portion 360 of each row 356 of racks 358 is served by each DC power module 300. Thus, if, in the case of a malfunction or otherwise inability for power (e.g., DC power) to be delivered from a particular DC power module 300, power (and thus operation) is not lost for a whole row 356 of racks 358. In such an arrangement, diversity of power delivery is achieved so that a single row (or non-linear grouping) of server racks 358 is not rendered inoperational by a loss of a single DC power module 300.

Figure 4:
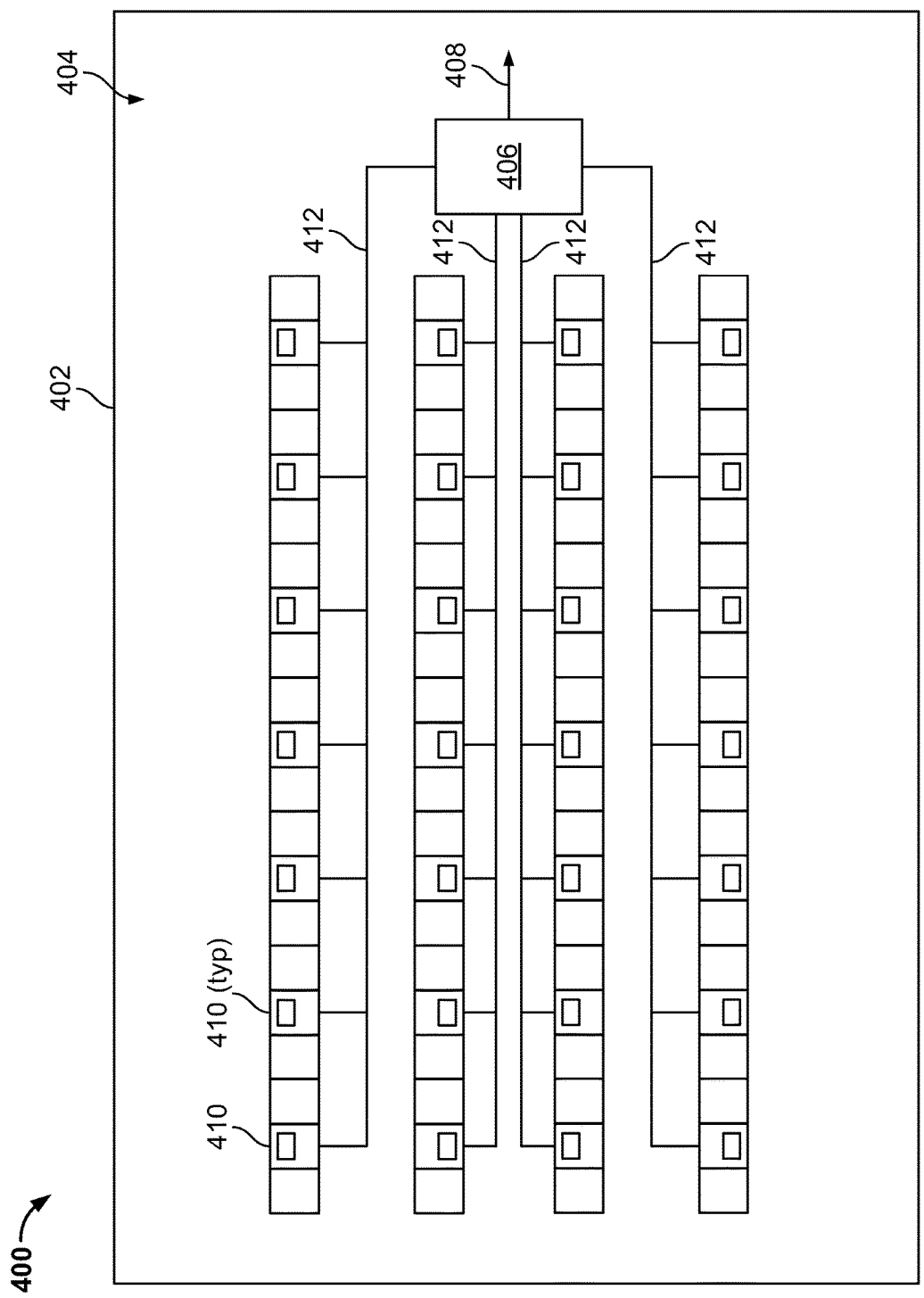
FIG. 4 is a schematic illustration of a data center that includes a control system that uses a data center power connector that transfers power and data between one or more server racks.

FIG. 4 is a schematic illustration of a data center 400 that includes a power-control system 406 that uses one or more data center power connectors 412 that transfers power and data between one or more server racks 410 and the power-control system 406. Based on the transferred data, for example, the power-control system 406 may generate one or more virtual models of the data center 400. In some aspects, the virtual models may provide for increased efficiency (e.g., cost, time, manpower, and otherwise) in performing such tasks as: inventory of the server racks 410 and one or more electronic devices supported in the racks 410; geographically identifying the server racks 410 and one or more electronic devices supported in the racks 410 within the human-occupiable workspace 404 of the data center 400; identifying the server racks 410 and one or more electronic devices supported in the racks 410 within a network topology 404 of the data center 400; identifying the server racks 410 and one or more electronic devices supported in the racks 410 within a cooling topology of the data center 400; and identifying the server racks 410 and one or more electronic devices supported in the racks 410 within a power topology of the data center 400, among other tasks.

The schematic illustration of the data center 400 in FIG. 4 is simplified in that particular structure is not shown, such as power delivery structure, cooling structure, and networking structure. The example implementation of the data center 400 in FIG. 4, therefore, could be implemented with, for example, the DC power systems shown in any one of FIGS. 1A-1D, 2A-2B, and 3A-3C, as well as other power, cooling, or networking structures that include a DC power delivery system for delivering DC power to electronic devices in server racks, a cooling system to cool the electronic devices in the server racks, and a networking system that communicably couples the electronic devices, where appropriate, to one or more networks, such as a local area network ("LAN"), a wide area network ("WAN"), peer-to-peer networks (having ad-hoc or static members), grid computing infrastructures, and the Internet. The example power-control system 406 is electrically coupled to a source of main power 408 (e.g., through one or more rectifiers and transformers). Of course, in alternative implementations, the example implementation of the data center 400 in FIG. 4 could be implemented with an AC power system, as well as other power, cooling, or networking structures that include an AC power delivery system for delivering AC power to electronic devices in server racks, a cooling system to cool the electronic devices in the server racks, and a networking system that communicably couples the electronic devices, where appropriate, to one or more networks, such as a LAN, a WAN, peer-to-peer networks (having ad-hoc or static members), grid computing infrastructures, and the Internet.

As shown, the power-control system 406 is communicably and electrically coupled to the server racks 410 through power connectors 412. The power-power-control system 406, in some aspects, can be a controller-based power delivery system, e.g., a micro-processor based power delivery system that delivers DC power to the server racks 410. For example, the power connectors 406 can be a controller-based data center power module 300. The power connectors 406 can also be at least a portion of the data center power system 100 or the data center power system 200. Thus, the power connectors 412 can be used, in some aspects, to connect the server racks 410 to one or more DC power modules 300, the DC power conductors 114, or the DC conductor assembly 210.

Each power connector 412 can deliver AC or DC power to one or more server racks 410 to power electronic devices (e.g., processors, memory, networking gear, cooling devices such as fans, and otherwise). Each power connector 412 can also transmit data between the server racks (e.g., between the electronic devices) and the control system 406. For example, in some aspects, each power connector 412 includes a power-line communications (PLC) conductor that simultaneously transmits data and AC or DC power. The PLC conductor can be a wideband or narrowband PLC conductor and deliver digital information as well as DC power. For example, the PLC conductor can be one of a number of standard DC PLC conductors, such as CAN-bus, LIN-bus over power line (DC-LIN), DC-BUS, and LonWorks. As further examples, as a DC PLC conductor, the power connectors 412 can utilize the SAE J1772 standard for PLC.

As described previously, each power connector 412 can include a single conductor that transmits both power and data. Alternatively, each power connector 412 comprises two conductors coupled within a single sheath or conduit. For example, one of the conductors can transmit data while the other of the conductors can transmit electrical power.

In operation, subsequent to electrically connecting the power-control system 406 to the server racks 410 with the power connectors 412, DC power is delivered through the power connectors 412 to the server racks 410 to power the electronic devices. Upon communicably and electrically coupling the power connectors 406 to the server racks 410, the power connectors 406 may initiate data transmission between the racks 410 and the power connectors 406 to generate one or more virtual models. For example, once connected, the power connectors 406 may poll (or otherwise request information from) the server racks 412 through the power connectors 412. Requested information may include, for example "identity" information about the respective server racks 410 and electronic devices supported on the server racks, such as a name, model, or serial number of each electronic device (e.g., processor, memory, switch, or otherwise) in each respective server rack 410, a server rack name or designation, and other identifying information. Such requests or polls may be performed periodically, only once after server rack installation in the data center 400, each instance of movement or replacement of a server rack or even electronic device within a server rack, or otherwise.

Once the identifying information is communicated to the power connectors 406, the power connectors 406 may build or complete one or more virtual models of the data center 400. One example virtual model may be a geographic topology model. For example, the power connectors 406 may associate the identifying information for each server rack 410, and even each electronic device within each server rack 410, with a specific geographic location within the human-occupiable workspace 404 of the data center building 402. In some aspects, the power connectors 406 may use GPS or other geographic association technique to associate the identifying information with a specific geographic location. In other aspects, prior to deployment of the server racks 410, the power connectors 406 may include or store a "blank" geographic topology of the data center 400 that includes proposed locations of the server racks 410 but does not include any identifying information that associates particular server racks 410 with the proposed locations (e.g., in rows, in groups, or otherwise). The received identifying information may, therefore, be input into the proposed locations to generate the geographic topology virtual model. In some aspects, the generated geographic model may be used so that specific locations of particular server racks 410 and individual components within the server racks 410 are known. Thus, if, for example, a component fails or malfunctions, it may be efficiently located within the data center 400 (which may include hundreds, thousands, or tens of thousands of such components).

Another example virtual model may be a networking topology model. For example, prior to deployment of the server racks 410, the power connectors 406 may include or store a "blank" networking topology of the data center 400 that includes proposed networking domains of the server racks 410. Each networking domain may define a number of server racks 410 (and electronic devices supported on such racks 410) that are communicably coupled on a common network within the data center 400. The "blank" networking topology may not include any identifying information that associates particular server racks 410 with the proposed network domains (e.g., that are defined by rows of racks, groups of racks, or otherwise). The received identifying information may, therefore, be input into the proposed domains to generate the networking topology virtual model. In some aspects, the generated networking model may be used so that specific network domains in which particular server racks 410 and individual components within the server racks 410 are included may be known. Thus, if, for example, a network domain fails or malfunctions, the particular racks 410 or electronic devices within those racks 410 that are within the failed domain may be, for example, rerouted to another domain.

Another example virtual model may be a cooling topology model. For example, prior to deployment of the server racks 410, the power connectors 406 may include or store a "blank" cooling topology of the data center 400 that includes proposed cooling domains of the server racks 410. Each cooling domain may define a number of server racks 410 (and electronic devices supported on such racks 410) that are cooled by a particular cooling unit (e.g., fan coil unit, CRAC unit, chiller, evaporative cooling unit such as a cooling tower, fan, pump, heat pump, condensing unit, or otherwise) within the data center 400. The "blank" cooling topology may not include any identifying information that associates particular server racks 410 with the proposed cooling domains (e.g., that are defined by rows of racks, groups of racks, or otherwise). The received identifying information may, therefore, be input into the proposed domains to generate the cooling topology virtual model. In some aspects, the generated cooling model may be used so that specific cooling domains in which particular server racks 410 and individual components within the server racks 410 are included may be known. Thus, if, for example, a cooling domain fails or malfunctions (e.g., through failure of one or more cooling units for such domain), the particular racks 410 or electronic devices within those racks 410 that are within the failed domain may be, for example, moved to another cooling domain or another cooling domain may be adjusted (e.g., with increased airflow or other cooling fluid flow) to cool the racks 410 within the failed domain. Additionally, in some aspects, the cooling topology may be used to determine a failure of one or more cooling units within a cooling domain. For example, based on a sensed parameter (e.g., temperature or otherwise) of a particular server rack 410, such as temperature of an electronic device in the particular rack 410, temperature of an airflow that exits the particular rack 410 (e.g., into a warm air aisle adjacent the rack 410), or other parameter, the power connectors 406 may determine that one or more cooling units that serve a cooling domain in which the particular server rack 410 is located have failed or is otherwise non-functioning. Thus, maintenance or replacement of the failed cooling unit(s) may be performed.

Another example virtual model may be a power topology model. For example, prior to deployment of the server racks 410, the power connectors 406 may include or store a "blank" power topology of the data center 400 that includes proposed power domains of the server racks 410. Each power domain may define a number of server racks 410 (and electronic devices supported on such racks 410) that are electrically coupled on a common power domain within the data center 400. In some aspects, a power domain may be defined as a group of one or more server racks 410, electronic devices, or other power consuming devices (e.g., cooling or lighting) that receive electrical power from a particular power conductor of the data center power system, a particular DC power module of the data center power system, a particular transformer of the data center power system, a particular rectifier of the data center power system, a particular power source of the data center power system, or a combination of such components of the data center power system. The "blank" power topology may not include any identifying information that associates particular server racks 410 with the proposed power domains. The received identifying information may, therefore, be input into the proposed domains to generate the power topology virtual model and link the deployed server racks 410 (and associated electronic devices) with at least one of the proposed power domains). In some aspects, the generated power model may be used so that specific power domains in which particular server racks 410 and individual components within the server racks 410 are included may be known. Thus, if, for example, a power domain (e.g., a power component that is part of such domain) fails or malfunctions, the particular racks 410 or electronic devices within those racks 410 that are within the failed domain may be, for example, receive power that is rerouted from another power domain.

One or more of the example virtual models may be periodically (e.g., from time to time, at proscribed time periods, dynamically in real time, or otherwise) updated based on, for example, updated identifying information. For instance, the power connectors 406 may initiate or be polled for the identifying information to be transmitted between the racks 410 and the power connectors 406. This may occur periodically (e.g., once a week, once a month, once a day, or otherwise). This may also occur dynamically, such as when initiated by a data center operator, when one or more electronic devices or server racks are adjusted (e.g., physically or virtually), or otherwise. Identity information about the respective server racks 410 and electronic devices supported on the server racks may be updated with subsequent (e.g., to initial start-up of the server racks 410 or the data center) data transmissions. Once the identity information is identified as being updated, the generated virtual model(s) may be updated with the new identity information.

Generating the described virtual models may provide several advantages over conventional techniques for locating server racks and/or electronic devices within a data center. For example, conventional techniques may include having a human operator visually examine and record individual locations of each server rack (of tens, hundreds, or thousands of racks in the data center). Such visual examination and recordal is fraught with errors and incompleteness that is reduced or eliminated with the generated virtual models according to the present disclosure. For example, the generated virtual models may be more accurate as identification and recordal of the server rack-specific and electronic device-specific identifying information is automatically performed by the power-control system 406. Further, such identification and recordal of the server rack-specific and electronic device-specific identifying information by the power-control system 406 can be initiated and completed at any time, as well as multiple times more easily than conventional techniques, such as each instance of server rack or electronic device movement, removal, or replacement. In addition, replacement of particular data center infrastructure equipment (e.g., cooling units, power delivery components, networking components) may not affect the generated virtual models. Also, the described virtual models may provide dynamic or real time status of the server racks and/or electronic devices for cooling requirements, power requirements, asset diagnostics and management, as well as dynamic mapping of the data center floor.

FIG. 5 is a schematic illustration of an example controller 500 (or control system) for a data center power system, such as the power-control system 406. For example, the controller 500 may be communicably coupled with, or as a part of, a data center power system that includes one or more power connectors, such as the power connectors 412, to provide power to one or more racks that support electronic devices.

The controller 500 is intended to include various forms of digital computers, such as printed circuit boards (PCB), processors, digital circuitry, or otherwise that is part of a vehicle. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 500 includes a processor 510, a memory 520, a storage device 530, and an input/output device 540. Each of the components 510, 520, 530, and 540 are interconnected using a system bus 550. The processor 510 is capable of processing instructions for execution within the controller 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the controller 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the controller 500. In one implementation, the storage device 530 is a computer-readable medium. In various different implementations, the storage device 530 may be a floppy disk device, a hard disk device, an optical disk device, or a tape device.

The input/output device 540 provides input/output operations for the controller 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A data center power system, comprising:
an enclosure that defines an inner volume;

a first direct current (DC) power bus mounted in the inner volume and extending externally from the enclosure to electrically couple to a source of main power;
a second DC power bus mounted in the inner volume and extending externally from the enclosure to electrically couple to the source of main power;
a plurality of transfer switches mounted in the inner volume, each transfer switch electrically coupled to one of the first DC power bus or the second DC power bus; and
a plurality of DC power conductors, each DC power conductor electrically coupled to a pair of transfer switches that comprises one transfer switch electrically coupled to the first DC power bus and one transfer switch electrically coupled to the second DC power bus; each DC power conductor configured to electrically couple to a data center rack that supports a plurality of electronic devices,
wherein the first and second DC power busses are configured such that one of the first or second DC power busses is electrically decoupled from the source of main power for maintenance performance on the one of the first or second DC power busses, and concurrently with maintenance performance, DC power is provided from the other of the first or second DC power busses to the DC power conductor through the respective first or second plurality of transfer switches.

2. The data center power system of claim 1, wherein at least a portion of the plurality of transfer switches comprises an automatic transfer switch.

3. The data center power system of claim 1, wherein at least a portion of the plurality of transfer switches comprises a fused contact.

4. The data center power system of claim 1, wherein the source of main power is electrically coupled, through a power converter, to the first and second DC power busses.

5. The data center power system of claim 4, wherein the source of main power comprises at least one of a utility grid power source or a backup power source.

6. The data center power system of claim 5, wherein the backup power source comprises at least one of a generator power source or a renewable power source.

7. The data center power system of claim 1, wherein the first DC power bus and the second DC power bus are isolated from each other in the enclosure.

8. A method of delivering direct current (DC) power to a data center rack, comprising:
providing DC power from a source of main power to a first DC power bus mounted in an inner volume of an enclosure;
providing DC power from the source of main power to a second DC power bus mounted in the inner volume of the enclosure;
feeding the DC power from the first DC power bus to a first plurality of transfer switches mounted in the inner volume;
feeding the DC power from the second DC power bus to a second plurality of transfer switches, that are exclusive of the first plurality of transfer switches, mounted in the inner volume;
supplying: (i) DC power from one of the first plurality of transfer switches, or (ii) DC power from one of the second plurality of transfer switches, to a DC power conductor that is electrically coupled to a data center rack that supports a plurality of electronic devices;
powering the plurality of electronic devices with the supplied DC power;
electrically decoupling one of the first or second DC power busses from the source of main power;
performing maintenance on the one of the first or second DC power busses; and
concurrently with performing maintenance, feeding the DC power from the other of the first or second DC power busses to the DC power conductor through the respective first or second plurality of transfer switches.

9. The method of claim 8, wherein each of the plurality of transfer switches comprises an automatic transfer switch.

10. The method of claim 8, wherein each of the plurality of transfer switches comprises a fused contact.

11. The method of claim 8, wherein the source of main power comprises alternating current (AC) power, the method further comprising inverting the AC power to the DC power prior to providing the DC power to the first DC power bus and the second DC power bus.

12. The method of claim 8, wherein the source of main power comprises at least one of a utility grid power source or a backup power source.

13. The method of claim 12, further comprising electrically coupling the first and second DC power busses, through a power converter, to both the utility grid power source and the backup power source.

14. The method of claim 13, further comprising
detecting a loss of main power from the utility power grid; and
based on the detected loss, switching from providing DC power to the first and second DC power busses from the utility power grid to providing DC power to the first and second DC power busses from the backup power source.

15. A data center power system, comprising:
a first direct current (DC) switchboard module, comprising:
an enclosure,
a first DC power bus mounted in the enclosure and extending externally from the enclosure to electrically couple to a source of main power,
a second DC power bus mounted in the enclosure and extending externally from the enclosure to electrically couple to the source of main power,
a plurality of transfer switches mounted in the enclosure, each transfer switch electrically coupled to one of the first DC power bus or the second DC power bus, and
a plurality of DC power conductors, each DC power conductor electrically coupled to a pair of transfer switches that comprises one transfer switch electrically coupled to the first DC power bus and one transfer switch electrically coupled to the second DC power bus; and
a first plurality of racks that comprise a plurality of electronic devices, each of at least a portion of the first plurality of racks electrically coupled to a particular DC power conductor of the first DC switchboard module,
wherein the first and second DC power busses are configured such that one of the first or second DC power busses is electrically decoupled from the source of main power for maintenance performance on the one of the first or second DC power busses, and concurrently with maintenance performance, DC power is provided from the other of the first or second DC power busses to the DC power conductor through the respective first or second plurality of transfer switches.

16. The data center power system of claim 15, further comprising:

a second DC switchboard module, comprising:
  an enclosure;
    a first DC power bus mounted in the enclosure and extending externally from the enclosure to electrically couple to a source of main power;
    a second DC power bus mounted in the enclosure and extending externally from the enclosure to electrically couple to the source of main power;
    a plurality of transfer switches mounted in the enclosure, each transfer switch electrically coupled to one of the first DC power bus or the second DC power bus; and
    a plurality of DC power conductors, each DC power conductor electrically coupled to a pair of transfer switches that comprises one transfer switch electrically coupled to the first DC power bus and one transfer switch electrically coupled to the second DC power bus; and
a second plurality of racks that comprise a plurality of electronic devices, each of at least a portion of the second plurality of racks electrically coupled to a particular DC power conductor of the second DC switchboard module.

17. The data center power system of claim 16, wherein each of another portion of the second plurality of racks is electrically coupled to a particular DC power conductor of the first DC switchboard module, and each of another portion of the first plurality of racks is electrically coupled to a particular DC power conductor of the second DC switchboard module.

18. The data center power system of claim 17, wherein the portion of the second plurality of racks and the other portion of the second plurality of racks are positioned in separate rows of a plurality of rows of racks in the data center.

19. The data center power system of claim 17, wherein the portions of the first and second pluralities of racks are positioned in one particular row of the plurality of rows of racks.

* * * * *

UNITED STATES PATENT AND TRADEMARK OFFICE
CERTIFICATE OF CORRECTION

PATENT NO. : 10,306,797 B2
APPLICATION NO. : 15/395756
DATED : May 28, 2019
INVENTOR(S) : Sakalkar et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 92 days.

Signed and Sealed this
Nineteenth Day of May, 2020

Andrei Iancu
*Director of the United States Patent and Trademark Office*